(12) United States Patent
Kim et al.

(10) Patent No.: US 12,125,544 B2
(45) Date of Patent: Oct. 22, 2024

(54) NONVOLATILE MEMORY DEVICE WITH MULTIPLE CLOCKS

(71) Applicant: SAMSUNG ELECTRONICS CO., LTD., Suwon-si (KR)

(72) Inventors: You-Se Kim, Hwaseong-si (KR); Sang-Wan Nam, Hwaseong-si (KR); Kee Ho Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 17/871,358

(22) Filed: Jul. 22, 2022

(65) Prior Publication Data

US 2023/0133286 A1   May 4, 2023

(30) Foreign Application Priority Data

Nov. 2, 2021   (KR) .......................... 10-2021-0148406

(51) Int. Cl.
| | | |
|---|---|---|
| *G11C 16/32* | (2006.01) | |
| *G11C 16/04* | (2006.01) | |
| *G11C 16/14* | (2006.01) | |
| *G11C 16/24* | (2006.01) | |

(52) U.S. Cl.
CPC .......... *G11C 16/32* (2013.01); *G11C 16/0483* (2013.01); *G11C 16/14* (2013.01); *G11C 16/24* (2013.01)

(58) Field of Classification Search
CPC ..... G11C 16/32; G11C 16/0483; G11C 16/14; G11C 16/24; G11C 2029/0411; G11C 16/08; G11C 7/1006; G11C 7/1003; G11C 16/26; G11C 16/3404; G11C 5/066; G11C 29/42; G06F 11/1068; G06F 11/1048

See application file for complete search history.

(56) References Cited

U.S. PATENT DOCUMENTS

| | | | |
|---|---|---|---|
| 5,621,698 A | * | 4/1997 | Lee ...................... G11C 7/1006 365/194 |
| 6,560,164 B2 | | 5/2003 | Kawai et al. |
| 7,403,440 B2 | | 7/2008 | Perner |
| 8,169,846 B2 | | 5/2012 | Chung |

(Continued)

FOREIGN PATENT DOCUMENTS

KR   20080020920 A   3/2008

OTHER PUBLICATIONS

European Search Report Dated Jan. 4, 2023, Cited in Corresponding European Application No. EP22184406.1.

(Continued)

*Primary Examiner* — Ajay Ojha
(74) *Attorney, Agent, or Firm* — Fish & Richardson P.C.

(57) ABSTRACT

A nonvolatile memory device includes: a memory cell array including three or more planes; a first clock generator generating a first clock signal having a first period; a second clock generator generating a second clock signal having a second period that varies with the temperature; a plurality of clock switching controllers outputting one of the first and second clock signals as a reference clock signal; a control logic including a plurality of bitline shutoff generators, which output a plurality of bitline shutoff signals based on the reference clock signal; and a plurality of page buffers connecting bitlines of the planes and data latch nodes in accordance with the bitline shutoff signals.

20 Claims, 17 Drawing Sheets

(56) References Cited

U.S. PATENT DOCUMENTS

| | | |
|---|---|---|
| 9,042,175 B2 | 5/2015 | Sim et al. |
| 9,390,784 B2 | 7/2016 | Cho et al. |
| 9,514,831 B2 | 12/2016 | Hyunh et al. |
| 9,905,301 B2 | 2/2018 | Yoo et al. |
| 2017/0133096 A1 | 5/2017 | Yoo et al. |

OTHER PUBLICATIONS

European First Office Action Dated Jan. 30, 2023, Cited in Corresponding European Application No. EP22184406.1.

* cited by examiner

NONVOLATILE MEMORY DEVICE WITH MULTIPLE CLOCKS

CROSS-REFERENCE TO RELATED APPLICATION

This application claims priority from Korean Patent Application No. 10-2021-0148406 filed on Nov. 2, 2021, in the Korean Intellectual Property Office, and all the benefits accruing therefrom under 35 U.S.C. 119, the contents of which in its entirety are herein incorporated by reference.

BACKGROUND

1. Field

The present disclosure relates to a nonvolatile memory device.

2. Description of the Related Art

Nonvolatile memory devices are memory devices that do not lose their data when power supplied thereto is cut off. Examples of the nonvolatile memory devices include a read-only memory (ROM) device, a programmable ROM (PROM) device, an erasable PROM (EPROM) device, an electrically EPROM (EEPROM) device, a flash memory device, a parameter random-access memory (PRAM) device, a magnetoresistive random-access memory (MRAM) device, a resistive random-access memory (RRAM) device, and a ferroelectric random-access memory (FRAM) device. The flash memory device may be classified into a NOR type or a NAND type.

The operating characteristics of the nonvolatile memory devices may vary depending on the temperature, and as a result, error may occur.

SUMMARY

Aspects of the present disclosure provide a nonvolatile memory device with improved product reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided the nonvolatile memory device including a memory cell array including three or more planes; a first clock generator generating a first clock signal having a first period; a second clock generator generating a second clock signal having a second period that varies with temperature; a plurality of clock switching controllers outputting one of the first and second clock signals as a reference clock signal; a control logic including a plurality of bitline shutoff generators, which output a plurality of bitline shutoff signals based on the reference clock signal; and a plurality of page buffers connecting bitlines of the planes and data latch nodes in accordance with the bitline shutoff signals.

According to the aforementioned and other embodiments of the present disclosure, there is provided the nonvolatile memory device including a memory cell array including first and second planes; a first clock generator generating a first clock signal having a fixed first period; a second clock generator generating a second clock signal having a second period that varies with temperature; a first bitline shutoff signal generator outputting a first bitline shutoff signal based on the first and second clock signals; a second bitline shutoff signal generator outputting a second bitline shutoff signal based on the first and second clock signals; a first page buffer connecting a first bitline of the first plane and a first data latch node in accordance with the first bitline shutoff signal; and a second page buffer connecting a second bitline of the second plane and a second data latch node in accordance with the second bitline shutoff signal. As temperature increases, a difference between the first and second periods decreases.

According to the aforementioned and other embodiments of the present disclosure, there is provided the nonvolatile memory device including a memory cell array including three or more planes; a first clock generator generating a first clock signal having a first period; a second clock generator generating a second clock signal having a second period that varies; a plurality of clock switching controllers outputting the first clock signal as a reference clock signal during first and third periods, outputting the second clock signal as the reference clock signal during a second period, and outputting a signal having a first logic level as the reference clock signal during first and second switching periods; a control logic outputting a plurality of page buffer control signals based on the reference clock signal output by the clock switching controllers; and a plurality of page buffers operating in accordance with the page buffer control signals. The first period, the first switching period, the second period, the second switching period, and the third period are sequentially consecutive.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
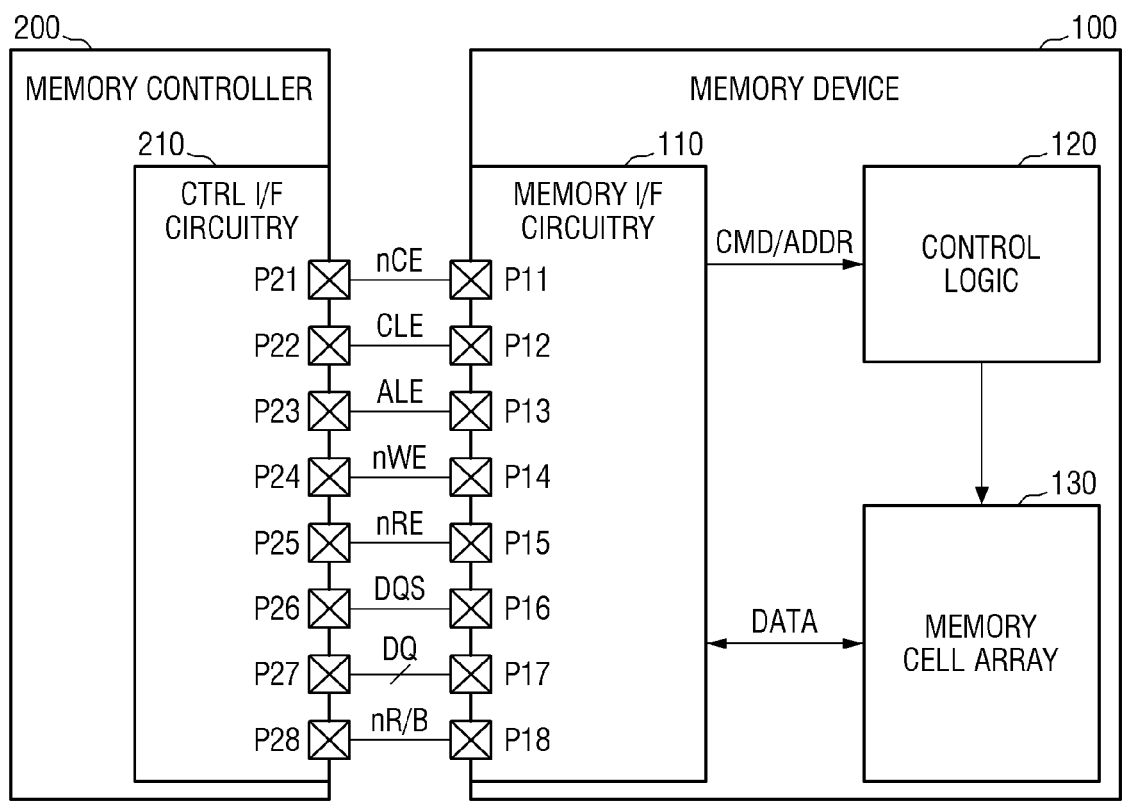
FIG. 1 is a block diagram of a memory system according to some embodiments of the present disclosure.

FIG. 1 is a block diagram of a memory system according to some embodiments of the present disclosure.

Referring to FIG. 1, the memory system may include a nonvolatile memory device 100 and a memory controller 200.

The nonvolatile memory device 100 may include first through eighth pins P11 through P18, a memory interface circuit 110, a control logic 120, and a memory cell array 130.

The memory interface circuit 110 may receive a chip enable signal nCE from the memory controller 200 through the first pin P11. The memory interface circuit 110 may transmit signals to, or receive signals from, the memory controller 200 through the second through eighth pins P12 through P18 in response to the chip enable signal nCE. For example, in a case where the chip enable signal nCE is in an enable state (e.g., a low-level state), the memory interface circuit 110 may transmit signals to, or receive signals from, the memory controller 200 through the second through eighth pins P12 through P18.

The memory interface circuit 110 may receive a command latch enable signal CLE, an address latch enable signal ALE, and a write enable signal nWE from the memory controller 200 through the second through fourth pins P12 through P14. The memory interface circuit 110 may receive/transmit data signals DQ from/to the memory controller 400 through the seventh pin P17. A command CMD, an address ADDR, and data DATA may be transmitted via the data signals DQ. For example, the data signals DQ may be transmitted through multiple signal lines. In this example, the seventh pin P17 may include a plurality of pins corresponding to a plurality of data signals DQ.

The memory interface circuit 110 may acquire the command CMD from a data signal received during an enable period (e.g., a high-level state) of the command latch enable signal CLE based on the toggle timings of the write enable signal nWE. The memory interface circuit 110 may acquire the address ADDR from a data signal DQ received during an enable period (e.g., a high-level state) of the address latch enable signal ALE based on the toggle timings of the write enable signal nWE.

The write enable signal nWE may maintain its static state (e.g., a high-level state or a low-level state) and may then toggle between a high level and a low level. For example, the write enable signal nWE may toggle during a period for the transmission of the command CMD or the address ADDR. As a result, the memory interface circuit 110 may acquire the command CMD or the address ADDR based on the toggle timings of the write enable signal nWE.

The memory interface circuit 110 may receive a read enable signal nRE from the memory controller 200 through the fifth pin P15. The memory interface circuit 110 may receive/transmit data strobe signals DQS from/to the memory controller 200 through the sixth pin P16.

During a data output operation of the nonvolatile memory device 100, the memory interface circuit 110 may receive the read enable signal nRE that toggles, through the fifth pin P15, before the output of the data DATA. The memory interface circuit 110 may generate a data strobe signal DQS that toggles based on the toggling of the read enable signal nRE. For example, the memory interface circuit 110 may generate a data strobe signal DQS that begins to toggle a predetermined delay (e.g., "tDQSRE") after the beginning of the toggling of the read enable signal nRE. The memory interface circuit 110 may transmit a data signal DQ including the data DATA based on the toggle timings of the data strobe signal DQS. Accordingly, the data may be transmitted to the memory controller 200 by being aligned with the toggle timings of the data strobe signal DQS.

During a data input operation of the nonvolatile memory device 100, in a case where a data signal DQ including the data DATA is received from the memory controller 200, the memory interface circuit 110 may receive a data strobe signal DQS, together with the data DATA. The memory interface circuit 110 may acquire the data DATA from the data signal DQ based on the toggle timings of the data strobe signal DQS. For example, the memory interface circuit 110 may acquire the data DATA by sampling the data signal DQ at rising and falling edges of the data strobe signal DQS.

The memory interface circuit 110 may transmit a ready/busy output signal nR/B to the memory controller 200 through the eighth pin P18. The memory interface circuit 110 may transmit state information of the nonvolatile memory device 100 to the memory controller 200 via the ready/busy output signal nR/B. In a case where the nonvolatile memory device 100 is busy (i.e., in a case where internal operations are being performed in the nonvolatile memory device 100), the memory interface circuit 110 may transmit a ready/busy output signal nR/B indicating that the nonvolatile memory device 100 is busy to the memory controller 200. In a case where the nonvolatile memory device 100 is in a ready state (i.e., in a case where internal operations are not being performed in the nonvolatile memory device 100 or are complete), the memory interface circuit 110 may transmit a ready/busy output signal nR/B indicating that the nonvolatile memory device 100 is ready to the memory controller 200. For example, the memory interface circuit 110 may transmit the ready/busy output signal nR/B indicating that the nonvolatile memory device 100 is busy (e.g., in a low-level state) to the memory controller 200 while the nonvolatile memory device 100 is reading the data DATA from the memory cell array 130 in response to a page read command. For example, the memory interface circuit 110 may also transmit the ready/busy output signal nR/B indicating that the nonvolatile memory device 100 is busy to the memory controller 200 while the nonvolatile memory device 100 is programming the data DATA to the memory cell array 130 in response to a program command.

The control logic 120 may control the general operation of the nonvolatile memory device 100. The control logic 120 may receive the command CMD and the address ADDR acquired from the memory interface circuit 110. The control logic 120 may generate control signals for controlling the other elements of the nonvolatile memory device 100 in accordance with the command CMD and the address ADDR. For example, the control logic 120 may program the data DATA to the memory cell array 130 or may generate control signals for reading the data DATA from the memory cell array 130.

The memory cell array 130 may store the data DATA, acquired from the memory interface circuit 110, under the control of the control logic 120. The memory cell array 130 may output the data DATA, stored under the control of the control logic 120, to the memory interface circuit 110.

The memory cell array 130 may include a plurality of memory cells. For example, the memory cells may be flash memory cells, but the present disclosure is not limited thereto. In another example, the memory cells may be resistive random-access memory (RRAM) cells, ferroelectric random-access memory (FRAM) cells, phase-change random-access memory (PRAM) cells, thyristor random-access memory (TRAM) cells, or magnetic random-access memory (MRAM) cells. The memory cells will hereinafter be described as being, for example, NAND flash memory cells.

The memory controller 200 may include first through eighth pins P21 through P28 and a controller interface circuit 210. The first through eighth pins P21 through P28 may correspond to the first through eighth pins P11 through P18 of the nonvolatile memory device 100.

The controller interface circuit 210 may transmit a chip enable signal nCE to the nonvolatile memory device 100 through the first pin P21. The controller interface circuit 210 may transmit signals to, or receive signals from, a nonvolatile memory device 100 selected by the chip enable signal nCE, through the second through eighth pins P22 through P28.

The controller interface circuit 210 may transmit a command latch enable signal CLE, an address latch enable signal ALE, and a write enable signal nWE to the nonvolatile memory device 100 through the second through fourth pins P22 through P24. The controller interface circuit 210 may transmit/receive data signals DQ to/from the nonvolatile memory device 100 through the seventh pin P27.

The controller interface circuit 210 may transmit a data signal DQ including a command CMD or an address ADDR to the nonvolatile memory device 100, together with the write enable signal nWE that toggles. The controller interface circuit 210 may transmit a data signal DQ including the data DQ to the nonvolatile memory device 100 upon the transmission of the command latch enable signal CLE and may transmit a data signal DQ including the address ADDR to the nonvolatile memory device 100 upon the transmission of the address latch enable signal ALE.

The controller interface circuit 210 may transmit a read enable signal nRE to the nonvolatile memory device 100 through the fifth pin P25. The controller interface circuit 210 may receive/transmit data strobe signals DQS from/to the nonvolatile memory device 100 through the sixth pin P26.

During a data output operation of the nonvolatile memory device 100, the controller interface circuit 210 may generate a read enable signal nRE that toggles and may transmit the read enable signal nRE to the nonvolatile memory device 100. For example, the controller interface circuit 210 may generate a read enable signal nRE that is switched from a static state (e.g., a high- or low-level state) to a toggle state, before the output of the data DATA. Accordingly, a data strobe signal DQS that toggles based on the read enable signal nRE may be generated in the nonvolatile memory device 100. The controller interface circuit 210 may receive a data signal DQ including the data DATA from the nonvolatile memory device 100, together with the data strobe signal DQS that toggles. The controller interface circuit 210 may acquire the data DATA from the received data signal DQ based on the toggle timings of the data strobe signal DQS.

During a data input operation of the nonvolatile memory device 100, the controller interface circuit 210 may generate a data strobe signal DQS that toggles. For example, the controller interface circuit 210 may generate a data strobe signal DQS that is switched from a static state (e.g., a high- or low-level state) to a toggle state, before the transmission of the data DATA. The controller interface circuit 210 may transmit a data signal DQ including the data DATA to the nonvolatile memory device 100 based on the toggle timings of the data strobe signal DQS.

The controller interface circuit 210 may receive a ready/busy output signal nR/B from the nonvolatile memory device 100 through the eighth pin P28. The controller interface circuit 210 may determine the state of the nonvolatile memory device 100 based on the ready/busy output signal nR/B.

Figure 2:
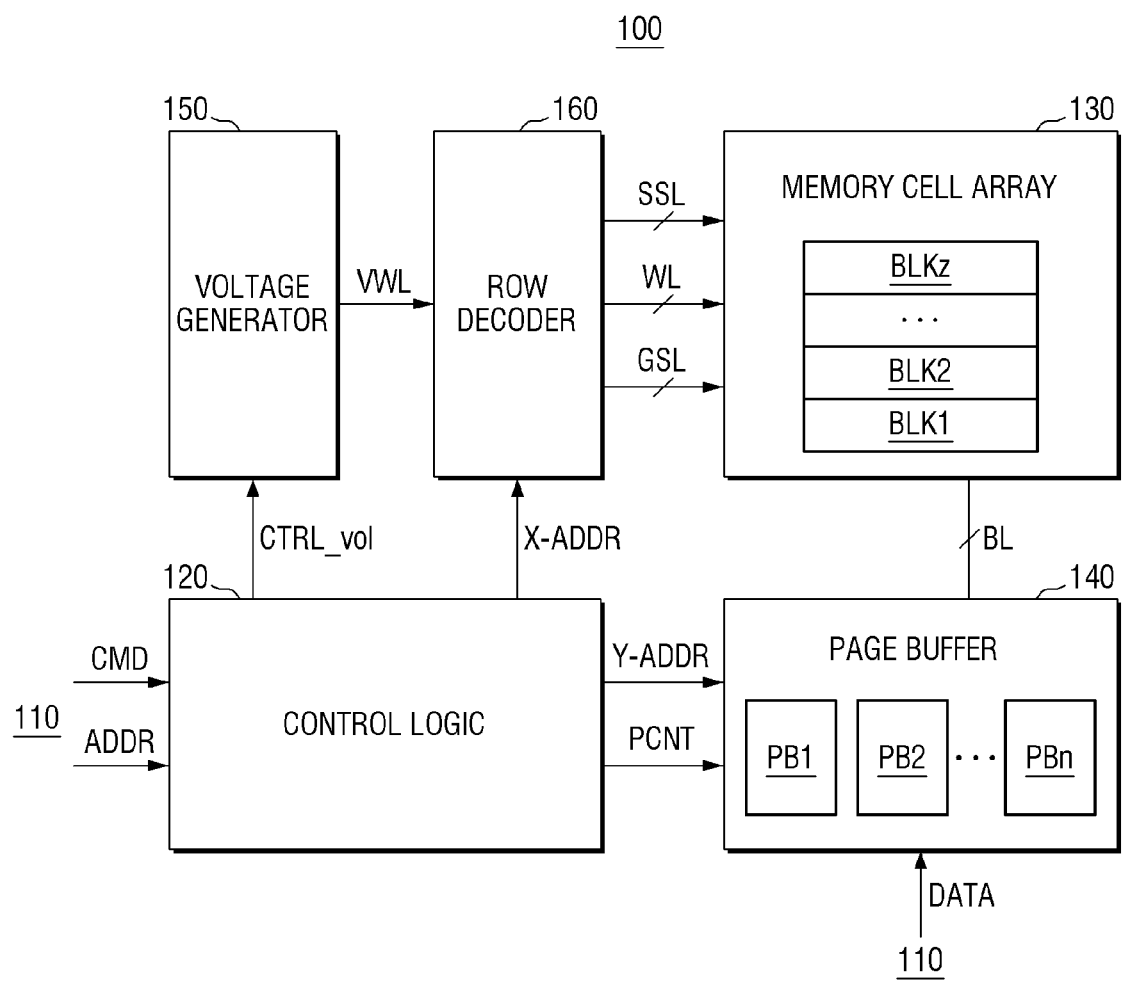
FIG. 2 is a block diagram of a nonvolatile memory device according to some embodiments of the present disclosure.

FIG. 2 is a block diagram of a nonvolatile memory device according to some embodiments of the present disclosure.

Referring to FIG. 2, a nonvolatile memory device 100 may include a control logic 120, a memory cell array 130, a page buffer unit 140, a voltage generator 150, and a row decoder 160. Although not specifically illustrated in FIG. 2, the nonvolatile memory device 100 may further include a memory interface circuit 110, a column logic, a pre-decoder, a temperature sensor, a command decoder, and an address decoder.

The control logic 120 may generally control various operations performed in the nonvolatile memory device 100. The control logic 120 may output various control signals in response to a command CMD and/or an address ADDR from the memory interface circuit 110. For example, the control logic 120 may output a voltage control signal CTRL_vol, a row address X-ADDR, and a column address Y-ADDR. The control logic 120 may output a page buffer control signal PCNT for controlling the page buffer unit 140.

The memory cell array 130 may include a plurality of memory blocks BLKz (where z is a positive integer), and each of the memory blocks may include a plurality of memory cells. The memory cell array 130 may be connected to the page buffer unit 140 through bitlines BL and may be connected to the row decoder 160 through wordlines WL, string selection lines SSL, and ground selection lines GSL.

The memory cell array 130 may include a three-dimensional (3D) memory cell array, and the 3D memory cell array may include a plurality of NAND strings. Each of the NAND strings may include memory cells connected to wordlines that are vertically stacked on a substrate. U.S. Pat. Nos. 7,679,133, 8,553,466, 8,654,587, and 8,559,235, and U.S. Patent Application Publication No. 2011/0233648 are incorporated herein by reference in their entirety. The memory cell array 130 may include a two-dimensional (2D) memory cell array, and the 2D memory cell array may include a plurality of NAND strings that are arranged in row and column directions.

The page buffer unit 140 may include a plurality of page buffers PB1 through PBn (where n is an integer of 3 or greater), and each of the page buffers PB1 through PBn may be connected to the memory cells through the bitlines BL. The page buffer unit 140 may select at least one of the bitlines BL in response to the column address Y-ADDR. The page buffer unit 140 may operate as a write driver or a sense amplifier depending on the operating mode of the nonvolatile memory device 100. For example, during a program operation, the page buffer unit 140 may apply, to the selected bitline BL, a bitline voltage corresponding to data to be programmed. For example, during a read operation, the page buffer unit 140 may sense a current or a voltage from the selected bitline BL to sense data stored in memory cells.

The voltage generator 150 may generate various voltages for performing a program operation, a read operation, and an erase operation based on the voltage control signal CTRL_vol. For example, the voltage generator 150 may generate a program voltage, a read voltage, a program verification voltage, and an erase voltage as wordline voltages VWL.

The row decoder 160 may select one of the wordlines WL in response to the row address X-ADDR and may select one of the string selection lines SSL. For example, during a program operation, the row decoder 160 may apply the program voltage and the program verification voltage to the selected wordline WL. For example, during a read operation, the row decoder 160 may apply the read voltage to the selected wordline WL.

Figure 3:
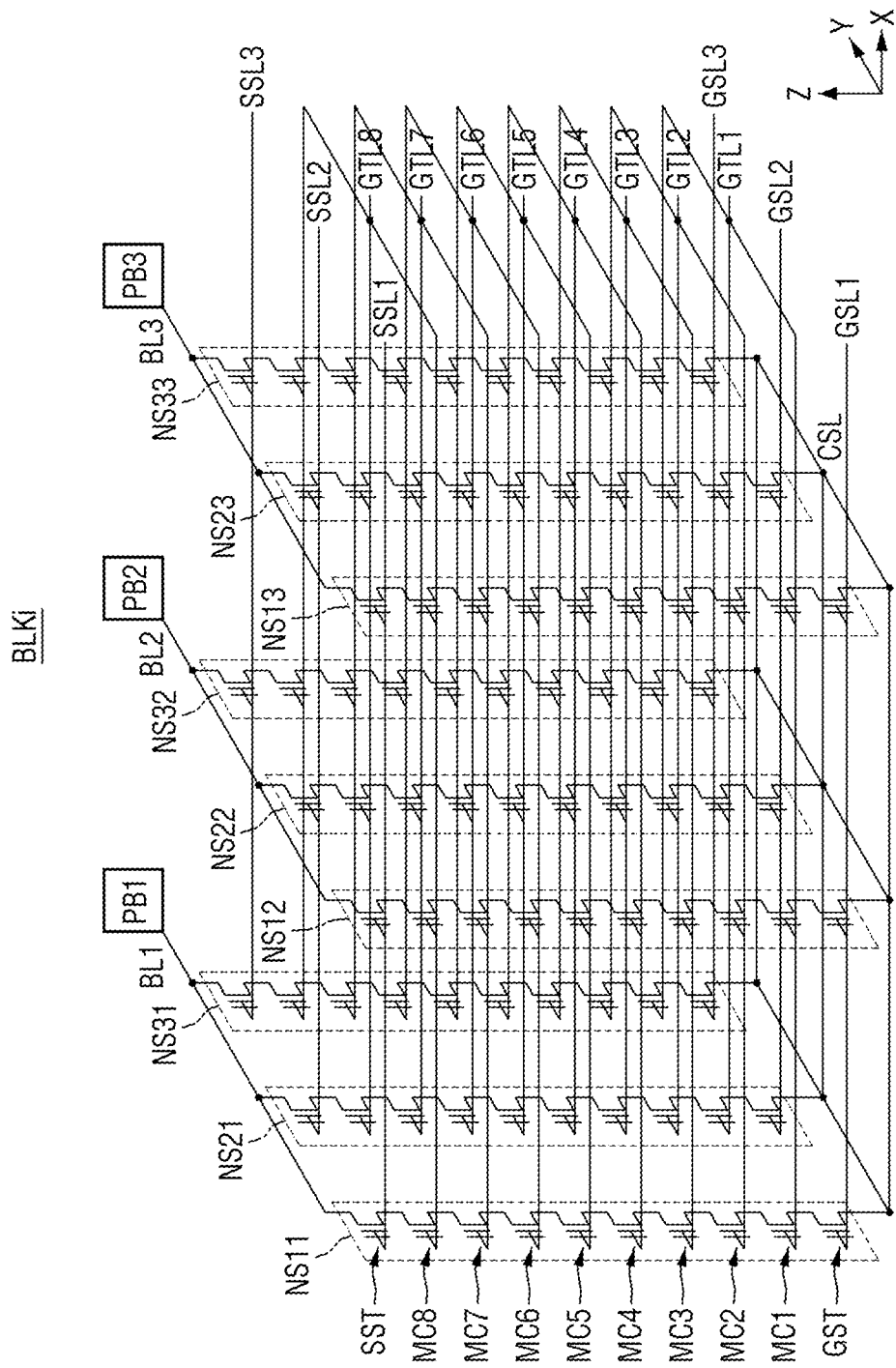
FIG. 3 illustrates a three-dimensional (3D) V-NAND structure that can be applied to a nonvolatile memory device according to some embodiments of the present disclosure.

FIG. 3 illustrates a 3D V-NAND structure that can be applied to a nonvolatile memory device according to some embodiments of the present disclosure. Each of the memory blocks BLK1 through BLKz of FIG. 2 may be expressed as an equivalent circuit as illustrated in FIG. 3.

Referring to FIG. 3, a memory block BLKi may be a 3D memory block formed into a 3D structure on a substrate. For example, a plurality of memory NAND strings included in the memory block BLKi may be formed in a vertical direction with respect to the substrate.

The memory block BLKi may include a plurality of memory NAND strings NS11 through NS33, which are connected between bitlines BL1 through BL3 and a common source line CSL. Each of the memory NAND strings NS11 through NS33 may include a string selection transistor SST, a plurality of memory cells MC1 through MC8, and a ground selection transistor GST. FIG. 3 illustrates that each of the memory NAND strings NS11 through NS33 includes eight memory cells, but the present disclosure is not limited thereto.

The string selection transistor SST may be connected to one of string selection lines SSL1 through SSL3. The memory cells MC1 through MC8 may be connected to gate lines GTL1 through GTL8, respectively. The gate lines GTL1 through GTL8 may correspond to wordlines, and some of the gate lines GTL1 through GTL8 may correspond to dummy wordlines. The ground selection transistor GST may be connected to one of ground selection lines GSL1 through GSL3. The string selection transistor SST may be connected to one of the bitlines BL1 through BL3, and the ground selection transistor GST may be connected to the common source line CSL. The bitlines BL1 through BL3 may be connected to page buffers PB1 through PB3, respectively. The page buffers PB1 through PB3 may correspond to the page buffers PB1 through PBn of the page buffer unit 140 of FIG. 2.

Wordlines WL of the same height (e.g., the wordline WL1) may be connected in common, and the ground selection lines GSL1 through GSL3 and the string selection lines SSL1 through SSL3 may be separated from one another. FIG. 3 illustrates that the memory block BLKi is connected to three gate lines and three bitlines, but the present disclosure is not limited thereto.

Figure 4:
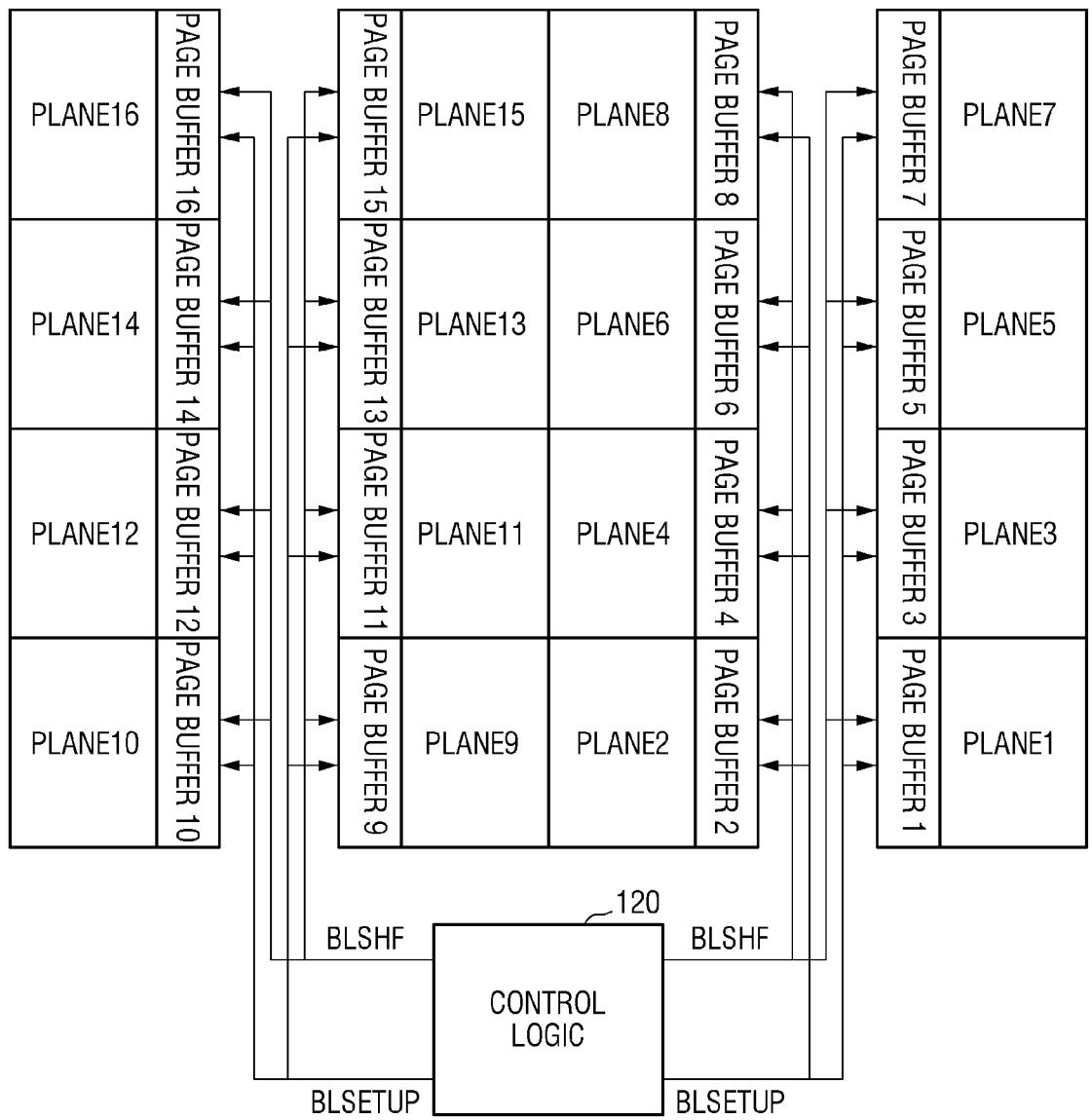
FIG. 4 is a block diagram of a nonvolatile memory device according to some embodiments of the present disclosure.

FIG. 4 is a block diagram of a nonvolatile memory device according to some embodiments of the present disclosure. FIG. 4 is a block diagram illustrating how a plurality of first through sixteenth planes PLANE1 through PLANE16, first through sixteenth page buffers "PAGE BUFFER 1" through "PAGE BUFFER 16", and the control logic 120 of the memory cell array 130 are connected.

Referring to FIGS. 2 and 4, the memory cell array 130 may include the first through sixteenth planes PLANE1 through PLANE16. Each of the first through sixteenth planes PLANE1 through PLANE16 may include a plurality of memory blocks BLK1 through BLKz, as illustrated in FIG. 2.

FIG. 4 illustrates that a total of 16 planes are provided, but the present disclosure is not limited thereto. The first through sixteenth planes PLANE1 through PLANE16 may include odd planes and even planes, but the present disclosure is not limited thereto.

The page buffer unit 140 may include the first through sixteenth page buffers "PAGE BUFFER 1" through "PAGE BUFFER 16". The first through sixteenth page buffers "PAGE BUFFER 1" through "PAGE BUFFER 16" may be disposed to correspond to the first through sixteenth planes PLANE1 through PLANE16, respectively, and may be connected to the planes PLANE1 through PLANE16, respectively. Each of the first through sixteenth page buffers "PAGE BUFFER 1" through "PAGE BUFFER 16" may correspond to the page buffer unit 140 of FIG. 2.

The control logic 120 may provide page buffer control signals PCNT to each of the first through sixteenth page buffers "PAGE BUFFER 1" through "PAGE BUFFER 16" to read data from each of the first through sixteenth page buffers "PAGE BUFFER 1" through "PAGE BUFFER 16". The page buffer control signals PCNT may include a bitline setup signal BLSETUP and a bitline shutoff signal BLSHF. Each of the bitline setup signal BLSETUP and the bitline shutoff signal BLSHF may be generated based on a reference clock signal rCLK, which is generated by first and second clock signal generators 121 and 122 of the control logic 120. That is, the number of clock signal generators in the control logic 120 may be smaller than the number of planes of the memory cell array 130.

The control logic 120 may read data from one of the first through sixteenth planes PLANE1 through PLANE16 or from at least two of the first through sixteenth planes PLANE1 through PLANE16 at the same time.

Figure 5:
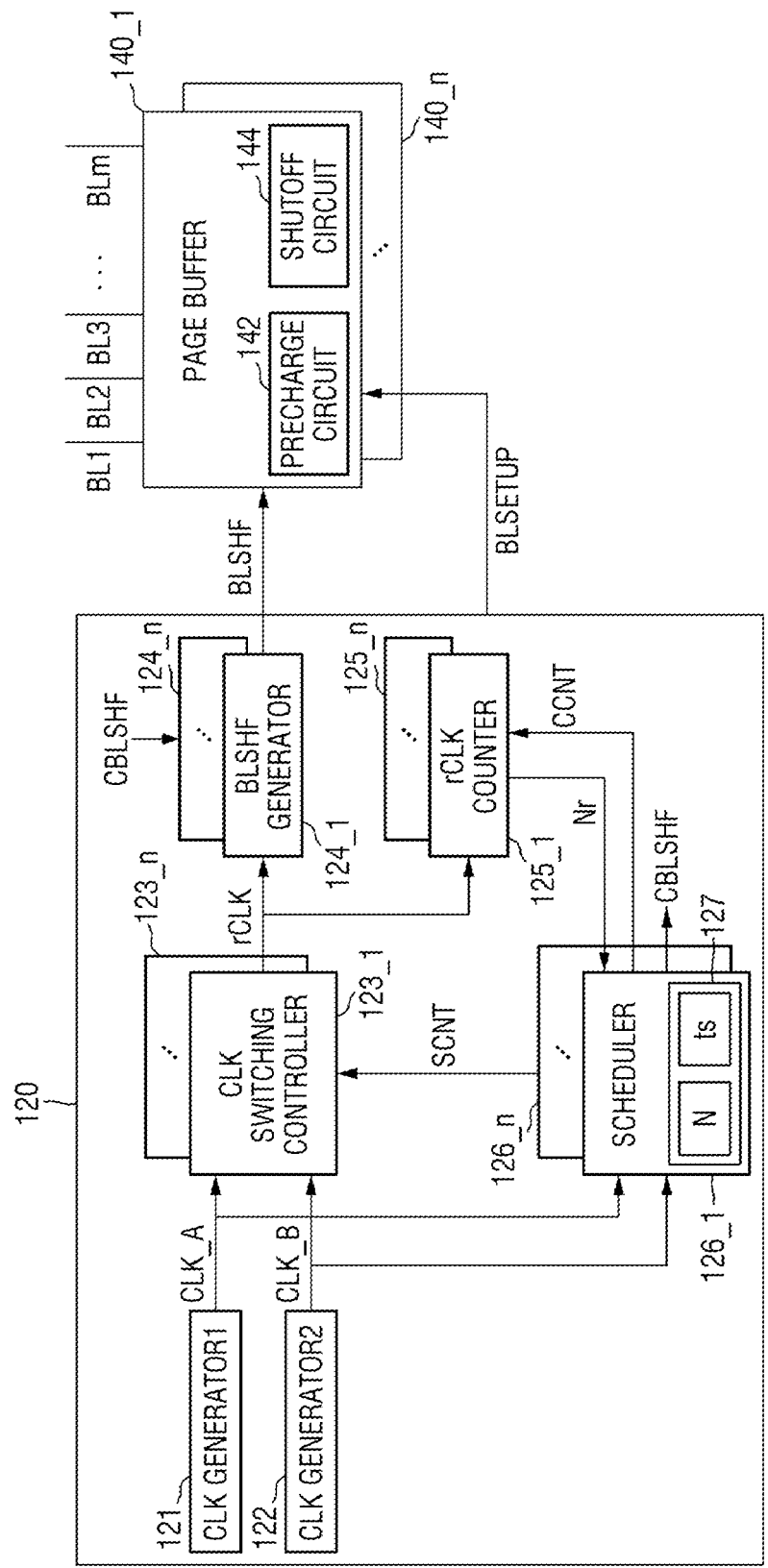
FIG. 5 is a block diagram of a nonvolatile memory device according to some embodiments of the present disclosure.
Figure 6:
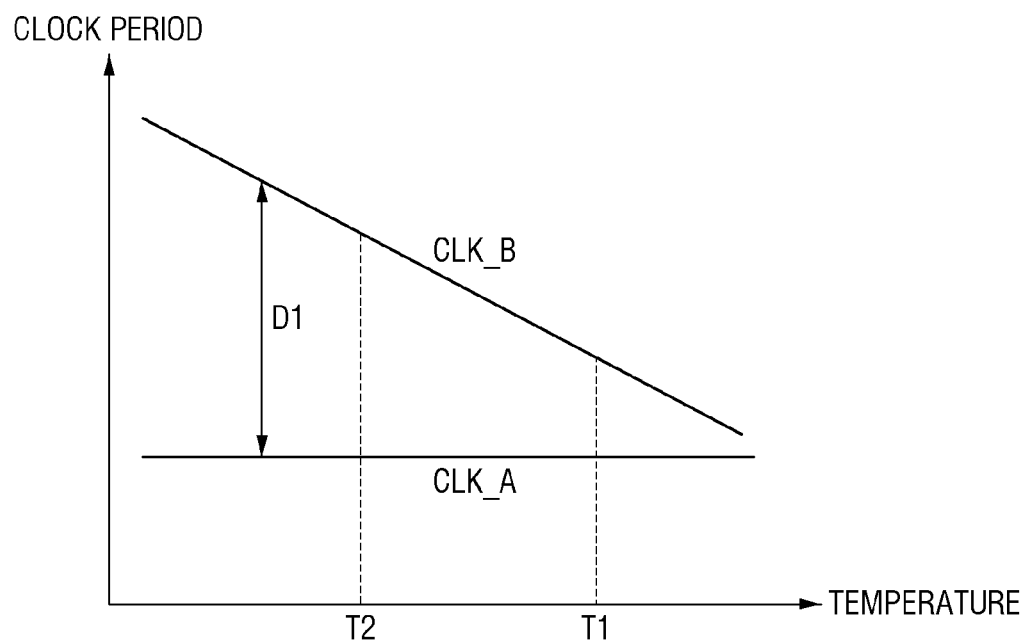
FIG. 6 is a graph for explaining first and second clock generators of FIG. 5.

FIG. 5 is a block diagram of a nonvolatile memory device according to some embodiments of the present disclosure. FIG. 5 is a block diagram illustrating how the control logic 120 and the page buffer unit 140 of FIG. 2 are connected. FIG. 6 is a graph for explaining the first and second clock generators of FIG. 5.

Referring to FIG. 5, the control logic 120 may include the first clock generator 121, the second clock generator 122, a plurality of first through n-th clock switching controllers 123_1 through 123_n, a plurality of first through n-th bitline shutoff signal generators 124_1 through 124_n, a plurality of first through n-th reference clock counters 125_1 through 125_n, and a plurality of first through n-th schedulers 126_1 through 126_n.

The first clock generator 121 may generate a first clock signal CLK_A having a first period. The first period may be fixed. That is, the first clock generator 121 may generate a first clock signal CLK_A having a fixed first period regardless of the temperature.

The second clock generator 122 may generate a second clock signal CLK_B having a second period. The second period may vary depending on the temperature. That is, the second clock generator 122 may measure the temperature of the nonvolatile memory device 100 and may generate a second clock signal CLK_B having a second period that varies depending on the temperature of the nonvolatile memory device 100.

Referring to FIG. 6, the first clock signal CLK_A may have a uniform period regardless of the temperature. The second clock signal CLK_B may have a period that increases as the temperature decreases. As the temperature increases, a difference D1 between the first period of the first clock signal CLK_A and the second period of the second clock signal CLK_B may decrease.

Referring again to FIG. 5, the first through n-th clock switching controllers 123_1 through 123_n may output one of the first and second clock signals CLK_A and CLK_B as the reference clock signal rCLK in accordance with switching control signals SCNT.

The first through n-th bitline shutoff signal generators 124_1 through 124_n may generate the bitline shutoff signal BLSHF based on a shutoff signal control signal CBLSHF and the reference clock signal rCLK.

The first through n-th reference clock counters 125_1 through 125_n may count the reference clock signal rCLK and may output a counting signal Nr. For example, the first through n-th reference clock counters 125_1 through 125_n may count the rising or falling edges of the reference clock signal rCLK. The first through n-th reference clock counters 125_1 through 125_n may be reset in accordance with a counter control signal CCNT.

The first through n-th schedulers 126_1 through 126_n may output various control signals for controlling the first through n-th page buffers 140_1 through 140_n and the row decoder 160 to perform program, read, and erase operations on memory cells selected by a command. The first through n-th schedulers 126_1 through 126_n may output various control signals such that a plurality of periods of an operation corresponding to a predetermined command may be performed in order.

The first through n-th schedulers 126_1 through 126_n may control the first through n-th page buffers 140_1 through 140_n, respectively, by controlling the reference clock signal rCLK. The first through n-th schedulers 126_1 through 126_n may generate the switching control signals SCNT such that the clock switching controller 123 may output a second clock signal CLK_B that varies with the temperature, during a particular period of the operation corresponding to the predetermined command. The first through n-th schedulers 126_1 through 126_n may reduce the occurrence of error in the nonvolatile memory device 100 that may be caused by the temperature and prevent an increase in the total operating time of the nonvolatile memory device 100, using the second clock signal CLK_B that varies with the temperature, only during a particular period of the operation that is sensitive to the temperature. The particular period may include a develop period for the bitlines BL1 through BLm, which is included in a verify operation of a read or program operation.

The first through n-th schedulers 126_1 through 126_n may output a shutoff signal control signal CLBSHF to the first through n-th bitline shutoff signal generators 124_1 through 124_n, respectively. The first through n-th schedulers 126_1 through 126_n may control the first through n-th bitline shutoff signal generators 124_1 through 124_n, respectively, such that the bitline shutoff signal BLSHF may be maintained at a second logic level during the particular period.

A plane independent read (PR) or plane independent core (PIC) method may be applied to the nonvolatile memory device 100 so that a read operation may be performed independently on multiple planes. Thus, during a particular period of the read operation for each of the multiple planes, the reference clock signal rCLK needs to be switched to the second clock signal CLK_B that varies with the temperature. Referring to FIGS. 4 and 5, the nonvolatile memory device 100 includes only two clock signal generators, i.e., the first and second clock signal generators 121 and 122, generates the reference clock signal rCLK using the first and second clock signal generators 121 and 122, and provides the bitline setup signal BLSETUP and the bitline shutoff signal BLSHF to the first through n-th page buffers 140_1 through 140_n based on the reference clock signal rCLK. Thus, increases in the chip size and the power consumption of the nonvolatile memory device 100 can be prevented, as compared to a case where the first and second clock generators 121 and 122 are provided for each of the multiple planes.

The first through n-th schedulers 126_1 through 126_n may store a count value N and a switching time is set in advance in a memory 127. The first through n-th schedulers 126_1 through 126_n will be described later with reference to FIGS. 5 through 10.

The first through n-th page buffers 140_1 through 140_n may operate as write drivers or sense amplifiers depending on the operating mode of the nonvolatile memory device 100. During a write operation, the first through n-th page buffers 140_1 through 140_n may transmit a bitline voltage corresponding to data to be written, to the bitlines BL1 through BLm. During a read operation, the first through n-th page buffers 140_1 through 140_n may sense data stored in selected memory cells, through the first through n-th bitlines BL1 through BLm. The first through n-th page buffers 140_1 through 140_n may latch the sensed data and may output the latched data to the outside.

Each of the first through n-th page buffers 140_1 through 140_n may include a precharge circuit 142 and a shutoff circuit 144. The precharge circuit 142 may include at least one transistor, which is controlled by the bitline setup signal BLSETUP, and the shutoff circuit 144 may include at least one transistor, which is controlled by the bitline shutoff signal BLSHF.

Figure 7:
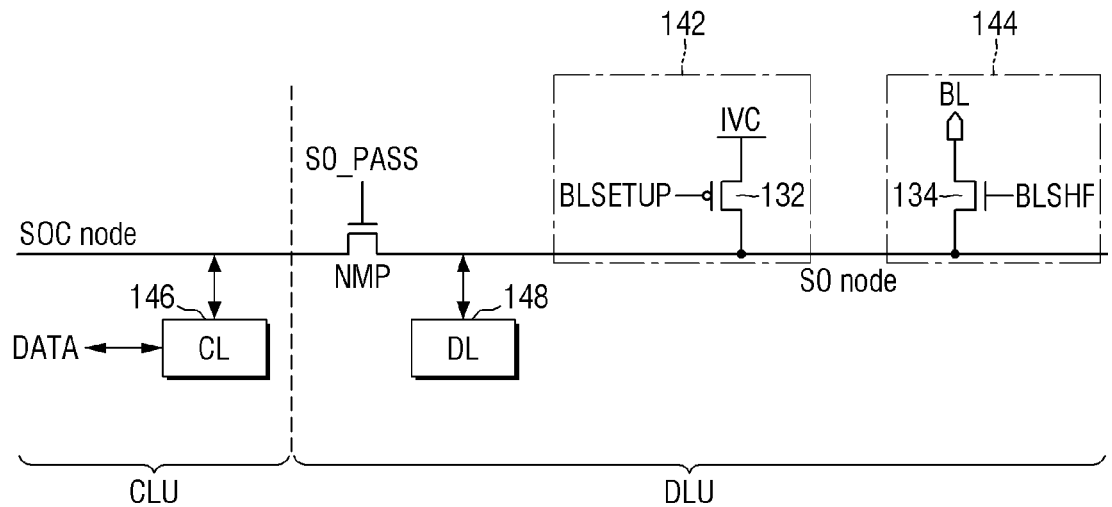
FIG. 7 illustrates a page buffer included in a page buffer unit of FIG. 2.

FIG. 7 illustrates a page buffer included in the page buffer unit of FIG. 2.

Referring to FIGS. 2 and 7, the page buffer PB1 may include a cache latch unit CLU and a data latch unit DLU.

The cache latch unit CLU may include a cache latch 146. The cache latch unit CLU may include two or more cache latches. For example, the cache latch 146 may store data DATA to be stored in memory cells. The cache latch 146 may also store data DATA received from a data latch 148. The cache latch 146 may be connected to a cache latch node "SOC node". The cache latch 146 may transmit or receive the data DATA through the cache latch node "SOC node".

The cache latch node "SOC node" may be connected to a data latch node "SO node" through a pass transistor NMP. The pass transistor NMP may be turned on or off by a pass signal SO_PASS. In a case where the pass transistor NMP is turned on, the data DATA may be transmitted between the cache latch 146 and the data latch 148.

The data latch unit DLU may include the data latch 148. The data latch unit DLU may include two or more data latches. For example, the data latch 148 may store data DATA received from the cache latch 146. The data latch 148 may also store data DATA read from memory cells. The data latch 148 may be connected to the data latch node "SO node". The data latch 148 may transmit or receive the data DATA through the data latch node "SO node".

A precharge circuit 142 may include a setup transistor 132. The data latch node "SO node" may be precharged during a read, write, or erase operation of the nonvolatile memory device 100. The data latch node "SO node" may be precharged via, for example, the setup transistor 132, in accordance with an internal supply voltage IVC. The setup transistor 132 may be turned on or off by the bitline setup signal BLSETUP. The setup transistor 132 may be a P-type transistor, but the type of the setup transistor 132 is not particularly limited.

A shutoff circuit 144 may include a shutoff transistor 134. The data latch node "SO node" may be connected to a bitline BL via, for example, the shutoff transistor 134. The shutoff transistor 134 may be turned on or off by the bitline shutoff signal BLSHF. Due to the shutoff transistor 134, the voltage of the data latch node "SO node" may gradually decrease from a precharge voltage to an off voltage in accordance with the level of the bitline shutoff signal BLSHF and the state of a selected memory cell. The shutoff transistor 134 may be an N-type transistor, but the type of the shutoff transistor 134 is not particularly limited.

Figure 8:
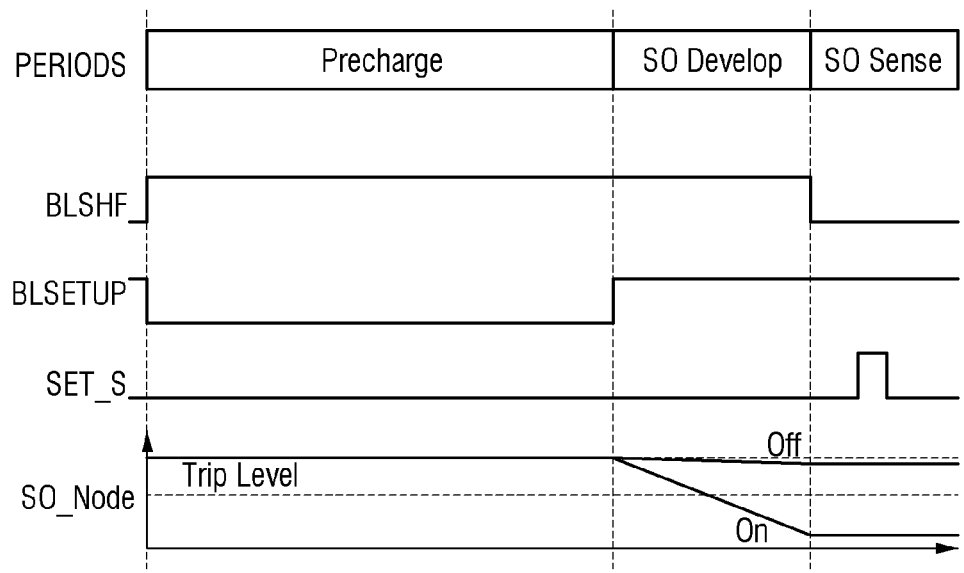
FIG. 8 is a timing diagram for explaining the operation of a data latch node in the page buffer of FIG. 7.

FIG. 8 is a timing diagram for explaining the operation of the data latch node in the page buffer of FIG. 7.

Referring to FIGS. 7 and 8, during a precharge period "Precharge", as the bitline setup signal BLSETUP has a logic low level, the setup transistor 132 may be turned on so that the data latch node "SO node" may be precharged by the internal supply voltage IVC. Also, as the bitline shutoff signal BLSHF has a logic high level, the shutoff transistor 134 may be turned on so that the bitline BL may be precharged together with the data latch node "SO node". That is, a precharge voltage may be provided to the bitline BL. The bitline BL and the data latch node "SO node" may be precharged to a predetermined level.

During a develop period "SO Develop", as the bitline setup signal BLSETUP has a logic high level, the setup transistor 132 may be turned off so that the application of a current from the internal supply voltage IVC to the data latch node "SO node" may be cut off. That is, the provision of the precharge voltage to the bitline BL may be cut off. As the bitline shutoff signal BLSHF is maintained at a logic high level, the setup transistor 132 may be turned on so that the voltage of the data latch node "SO node" may decrease depending on the state of the selected memory cell. The voltage of the data latch node "SO node" varies depending on whether the selected memory cell is on or off and on the magnitude of a current flowing into the bitline BL. In a case where the selected memory cell is an on cell, a relatively large current may flow in the bitline BL. Thus, the voltage of the data latch node "SO node" may decrease relatively fast. On the contrary, in a case where the selected memory cell is an off cell, the voltage of the data latch node "SO node" may be uniformly maintained or slightly decrease.

During a sensing period "SO Sense", in response to a sensing setting signal SET_S being activated, data is stored in the data latch 148 by sensing and amplifying a voltage variation in the data latch node "SO node" via the page buffer PB1. A particular amount of time later, the nonvolatile memory device 100 may detect the state of the selected memory cell by comparing the voltage of the data latch node "SO node" and a predefined reference level "Trip Level".

In a case where the selected memory cell is an on cell, the voltage of the data latch node "SO node" only needs to be greater than the reference level "Trip Level", and thus, the influence of the temperature is relatively small. In a case where the selected memory cell is an off cell, the rate at which the voltage of the data latch node "SO node" drops varies depending on the temperature. The rate at which the voltage of the data latch node "SO node" drops may generally decrease at low temperature. Thus, if the length of the develop period "SO Develop" is uniform regardless of the temperature, the occurrence of error is highly likely.

The nonvolatile memory device 100 can control the period for which the bitline shutoff signal BLSHF has a logic high level by using the second clock signal CLK_B that varies with the temperature as the reference clock signal rCLK. Accordingly, the length of the develop period "SO Develop" can be controlled in accordance with the temperature. Specifically, referring to FIG. 6, the lower the temperature, the longer the period of the second clock signal CLK_B and the longer the develop period "SO Develop". Therefore, the occurrence of error in the nonvolatile memory device 100 can be reduced.

Figure 9:
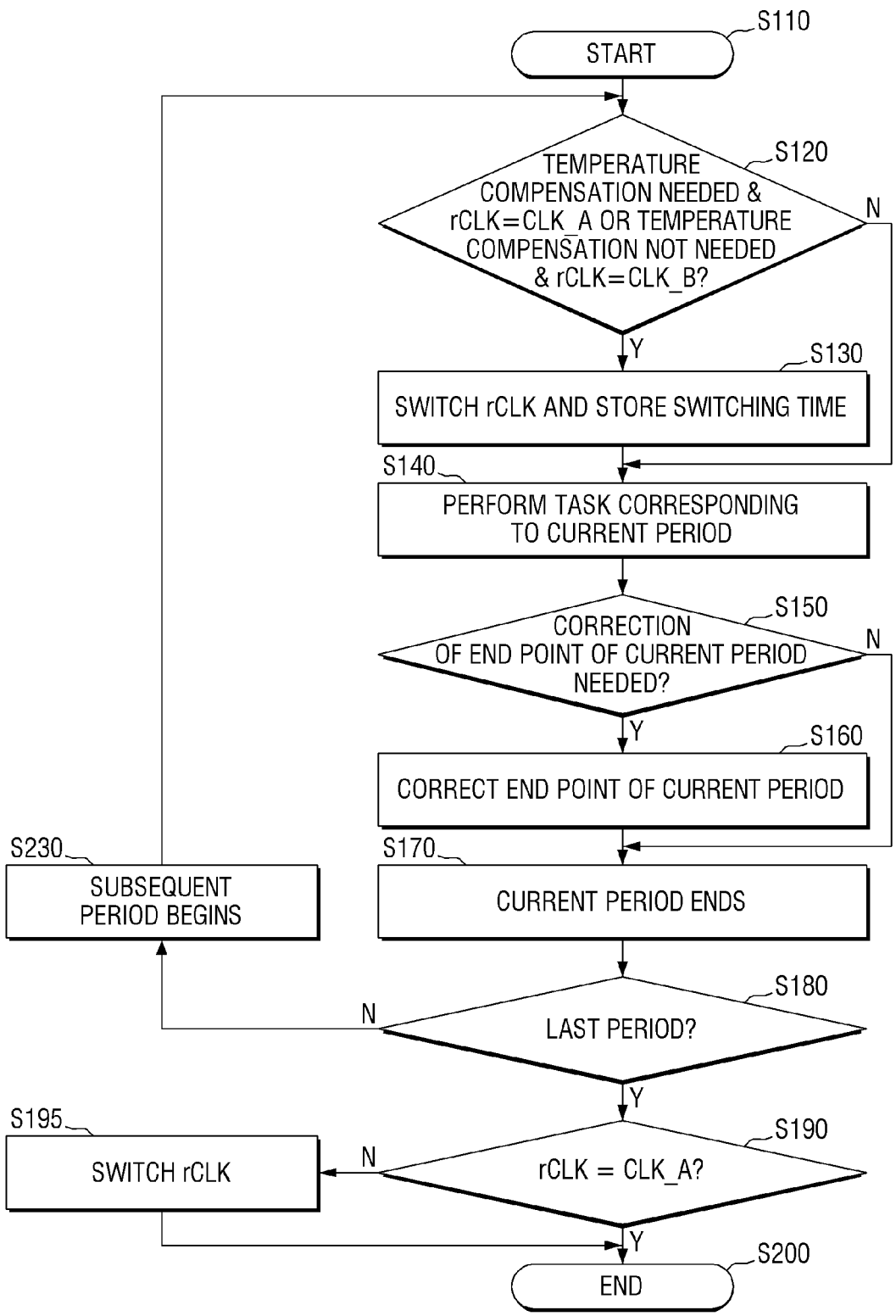
FIG. 9 is a flowchart illustrating the operation of a nonvolatile memory device according to some embodiments of the present disclosure.
Figure 10:
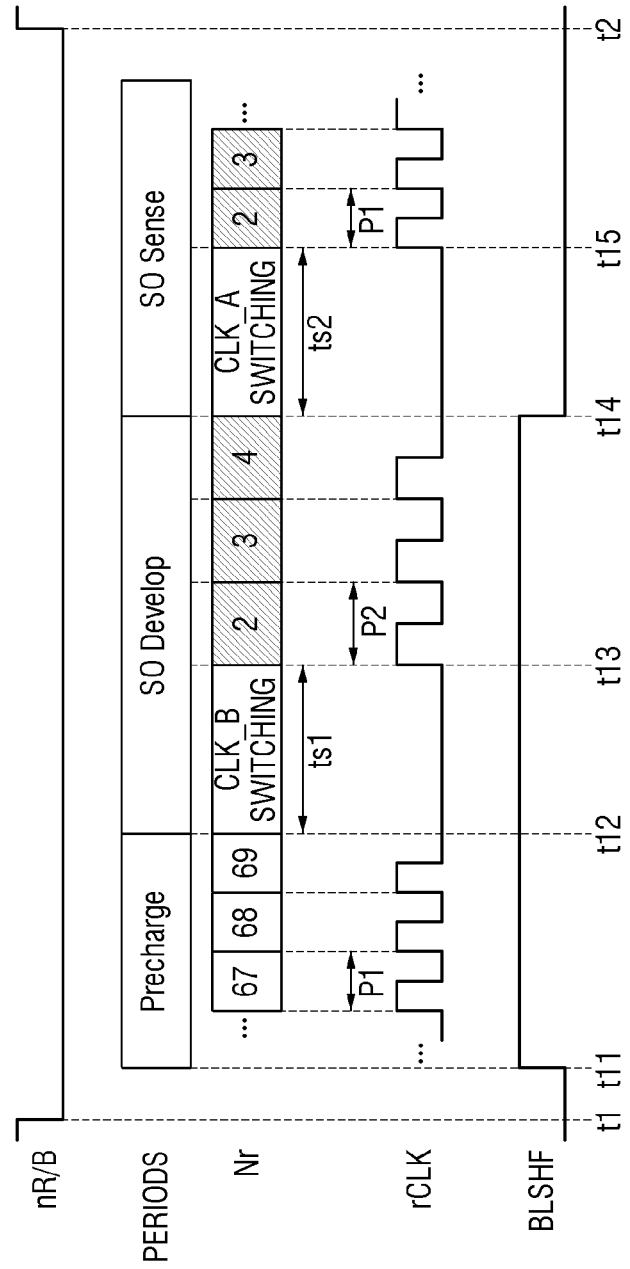
FIGS. 10, 11A, and 11B are timing diagrams illustrating the operation of the nonvolatile memory device of FIG. 9.
Figure 11A:
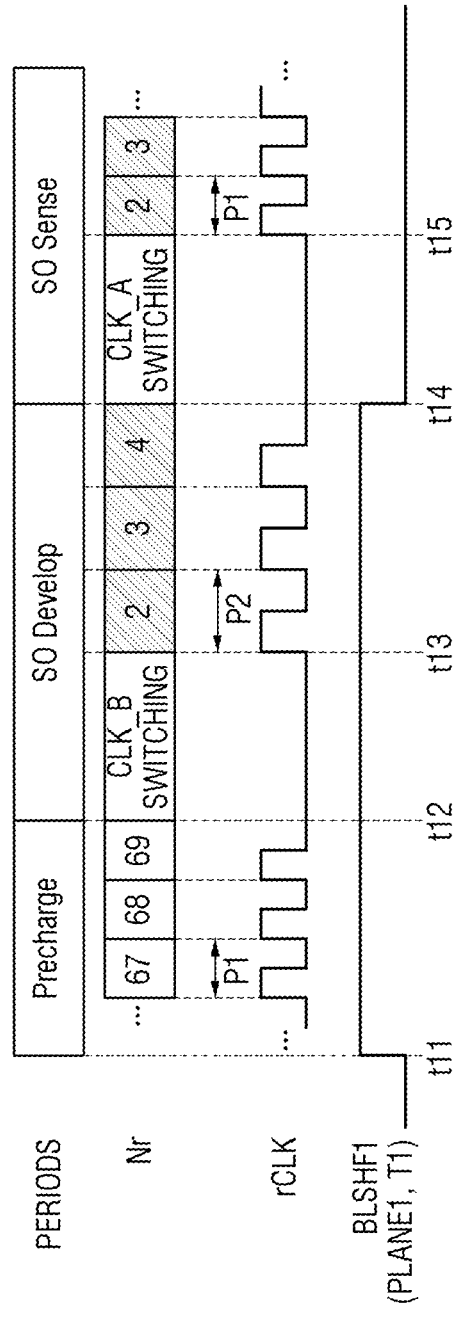
Figure 11B:
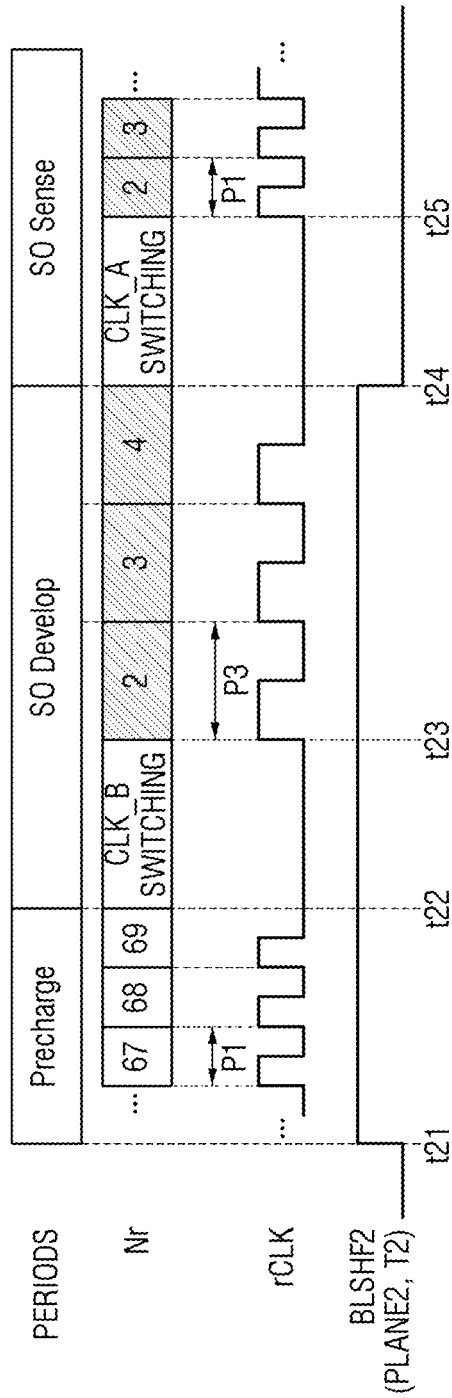

FIG. 9 is a flowchart illustrating the operation of a nonvolatile memory device according to some embodiments of the present disclosure. FIGS. 10, 11A, and 11B are timing diagrams illustrating the operation of the nonvolatile memory device of FIG. 9.

Referring to FIGS. 5 and 9, the control logic 120 may begin an operation corresponding to a predetermined command (S110). For example, the control logic 120 may begin a read operation, and the read operation may include a plurality of periods such as a precharge period, a develop period, and a sensing period.

Each of the first through n-th schedulers 126_1 through 126_n may determine, at the beginning of each of a plurality of periods of the operation, whether a corresponding period needs temperature compensation and whether the reference clock signal rCLK is the first clock signal CLK_A or the second clock signal CLK_B (S120). In a case where the operating characteristics of the nonvolatile memory device 100 change with the temperature during a current period of the operation, each of the first through n-th schedulers 126_1 through 126_n may determine that temperature compensation is needed. For example, each of the first through n-th schedulers 126_1 through 126_n may determine that temperature compensation is needed during the develop period, but not during the precharge and sensing periods.

In a case where the current period requires temperature compensation and the reference clock signal rCLK is the second clock signal CLK_B or in a case where the current period does not need temperature compensation and the reference clock signal rCLK is the first clock signal CLK_A (S120), the nonvolatile memory device 100 may perform a task corresponding to the current period in accordance with the reference clock signal rCLK (S140). Each of the first through n-th reference clock counter 125_1 through 125_n may generate a counting signal nR by counting the reference clock signal rCLK during the current period.

On the contrary, in a case where the current period needs temperature compensation and the reference clock signal rCLK is the first clock signal CLK_A or in a case where the current period does not need temperature compensation and the reference clock signal rCLK is the second clock signal CLK_B (S120), each of the first through n-th schedulers 126_1 through 126_n may switch the reference clock signal rCLK and may store the amount of time that it takes to switch the reference clock signal rCLK, i.e., the switching time is (S130). Each of the first through n-th schedulers 126_1 through 126_n may switch the reference clock signal rCLK by controlling the switching control signals SCNT. In the case where the current period needs temperature compensation and the reference clock signal rCLK is the first clock signal CLK_A, each of the first through n-th clock switching controllers 123_1 through 123_n may be connected to the second clock generator 122 in accordance with the switching control signals SCNT to output the second clock signal CLK_B as the reference clock signal rCLK. In the case where the current period does not need temperature compensation and the reference clock signal rCLK is the second clock signal CLK_B, each of the first through n-th clock switching controllers 123_1 through 123_n may be connected to the first clock generator 121 in accordance with the switching control signals SCNT to output the first clock signal CLK_A as the reference clock signal rCLK. Thereafter, S140 may be performed.

Each of the first through n-th schedulers 126_1 through 126_n may determine, at the end of the current period, whether the correction of the end point of the current period is needed (S150).

The end point of the current period may be the point in time at which an amount of time corresponding to the length of the current period expires after the beginning of the current period. The length of the current period may be a predetermined value N multiplied by the period of the reference clock signal rCLK used during the current period. The predetermined value N may be a value at which the reference clock signal rCLK is to be counted. The predetermined value N may differ from one period to another period of the operation.

In a case where the reference clock signal rCLK is switched during the current period, each of the first through n-th schedulers 126_1 through 126_n may determine that the correction of the end point of the current period is needed. Each of the first through n-th schedulers 126_1 through 126_n may determine at, for example, the end of the current period that the correction of the end point of the current period is needed if the counting signal Nr is smaller than the predetermined value N.

In a case where the correction of the end point of the current period is not needed (S150), the nonvolatile memory device 100 may end the current period (S170).

On the contrary, in a case where the correction of the end point of the current period is needed (S150), each of the first through n-th schedulers 126_1 through 126_n may correct the end point of the current period (S160). Each of the first through n-th schedulers 126_1 through 126_n may change the counting signal Nr into the predetermined value N. Thereafter, S170 may be performed. Accordingly, the nonvolatile memory device 100 can prevent the occurrence of error and an increase in the total operating time by finishing the operation in time regardless of the switching of the reference clock signal rCLK.

In S170, each of the first through n-th schedulers 126_1 through 126_n may determine whether the current period is the last period of the operation (S180). In a case where the current period is the last period of the operation (S180), each of the first through n-th schedulers 126_1 through 126_n may determine whether the reference clock signal rCLK is the first clock signal CLK_A (S190). In a case where the reference clock signal rCLK is the first clock signal CLK_A (S190), the operation may end (S200). In a case where the reference clock signal rCLK is the second clock signal CLK_B (S190), each of the first through n-th schedulers 126_1 through 126_n may switch the reference clock signal rCLK to the first clock signal CLK_A (S195). Thereafter, the operation may end (190).

On the contrary, in a case where the current period is not the last period of the operation (S180), a subsequent period may begin (S230), and S120 may be performed again on the subsequent period.

The operation of the nonvolatile memory device of FIG. 9 will hereinafter be described with reference to FIG. 10, taking the first plane PLANE1 as an example. Referring to FIGS. 5 and 10, the control logic 120 may perform an operation in accordance with a command. Accordingly, the nonvolatile memory device 100 may output a ready/busy output signal nR/B indicating that the nonvolatile memory device 100 is busy. The ready/busy output signal nR/B may be output through the nonvolatile memory circuit 110 of FIG. 1. In a case where the ready/busy output signal nR/B has a logic low level, the nonvolatile memory device 100 may be busy, but the present disclosure is not limited thereto. Alternatively, in a case where the ready/busy output signal nR/B has a logic high level, the nonvolatile memory device 100 may be busy.

At the beginning of a precharge period Precharge, i.e., at a time t11, as the precharge period Precharge does not need temperature compensation, the nonvolatile memory device 100 may use the first clock signal CLK_A as the reference clock signal rCLK and may perform a task corresponding to the precharge period Precharge.

At the end of the precharge period Precharge, i.e., at a time t12, as a subsequent period, i.e., a develop period "SO Develop" needs temperature compensation, the first clock switching controller 123_1, which corresponds to the first plane PLANE1, may switch the reference clock signal rCLK to the second clock signal CLK_B. The second clock generator 122 may determine a period P2 of the second clock signal CLK_B based on the temperature measured at the time t12. The higher the temperature measured at, for example, the time t12, the shorter the period P2 of the second clock signal CLK_B.

For example, the reference clock signal rCLK may have a uniform logic level during a period between the time t12 and a time t13 when the reference clock signal rCLK is being switched. For example, the reference clock signal rCLK may have a logic low level during the period between the time t12 and the time t13. In another example, the reference clock signal rCLK may have a logic high level during the period between the time t12 and the time t13. At the time t13, the first clock switching controller 123_1 may output a perfect second clock signal CLK_B without any glitch or short pulse as the reference clock signal rCLK. During the develop period "SO Develop", the nonvolatile memory device 100 may perform a task corresponding to the develop period "SO Develop", using the second clock signal CLK_B as the reference clock signal rCLK. That is, as the period for which the bitline shutoff signal BLSHF has a logic high level increases, the length of the develop period "SO Develop" (i.e., the length of a period between the time t12 and a time t14) may vary depending on the temperature.

At the end of the develop period "SO Develop", i.e., at the time t14, the counting signal Nr may be smaller than a predetermined value of 4 due to the switching time ts1. Thus, the first scheduler 126_1, which corresponds to the first plane PLANE1, may correct the counting signal Nr with the predetermined value of 4. As a result, the develop period "SO Develop" may be able to end at the time t14. The first scheduler 126_1 may determine a switching time ts1 by counting the first clock signal CLK_A or the second clock signal CLK_B. The length of the develop period "SO Develop" (i.e., the length of the period between the time t12 and the time t14) may be the period P2 of the second clock signal CLK_B multiplied by the predetermined value of 4. A hatched counting signal Nr may be a corrected signal, and a non-hatched counting signal Nr may be a non-corrected signal.

As a subsequent period, i.e., a sensing period "SO Sense", does not need temperature compensation, the first clock switching controller 123_1 may switch the reference clock signal rCLK to the first clock signal CLK_A. The reference clock signal rCLK may have a uniform logic level during a period between the time t14 and a time t15 when the reference clock signal rCLK is being switched. At the time t15, the first clock switching controller 123_1 may output a perfect first clock signal CLK_A without any glitch or short pulse as the reference clock signal rCLK. During the sensing period "SO Sense", the nonvolatile memory device 100 may perform a task corresponding to the sensing period "SO Sense", using the first clock signal CLK_A as the reference clock signal rCLK.

At the end of the sensing period "SO Sense", the counting signal Nr may be smaller than a predetermined value due to the switching time ts2. Thus, the first scheduler 126_1 may correct the end point of the sensing period "SO Sense" by correcting the counting signal Nr with the predetermined value. The switching time ts2 may have the same length as, or a different length from, the switching time ts1. The first scheduler 126_1 may determine the switching time ts2 by counting the second clock signal CLK_B.

Once the operation is completed, the nonvolatile memory device 100 may output a ready/busy output signal nR/B indicating that the nonvolatile memory device 100 is ready. During the output of the ready/busy output signal nR/B, the period of the reference clock signal rCLK may be changed.

FIG. 10 is a timing diagram for explaining how to perform an operation on one plane, and FIGS. 11A and 11B are timing diagrams illustrating how to perform an operation on two planes. For convenience, the embodiment of FIGS. 11A and 11B will hereinafter be described, focusing mainly on the differences with the embodiment of FIG. 10.

Referring to FIGS. 5, 11A, and 11B, a read operation for the first plane PLANE1 and a read operation for the second plane PLANE2 may be performed independently. The beginning of a precharge period "Precharge" for the first plane PLANE1, i.e., a time t11, and the beginning of a precharge period "Precharge" for the second plane PLANE2, i.e., a time t21, may be independent from each other. The nonvolatile memory device 100 may output a ready/busy output signal nR/B indicating that the nonvolatile memory device 100 is busy while a read operation for the first or second plane PLANE1 or PLANE2 is being performed.

During the precharge period "Precharge" for the first plane PLANE1, the first bitline shutoff signal generator 124_1 may generate a first bitline shutoff signal BLSHF1 based on the first clock signal CLK_A. During the precharge period "Precharge" for the second plane PLANE2, the second bitline shutoff signal generator 124_2 may generate a second bitline shutoff signal BLSHF2 based on the first clock signal CLK_A. Thus, the length of the precharge period "Precharge" for the first plane PLANE1 (i.e., the length of a period between the time t11 and a time t12) may be substantially the same as the length of the precharge period "Precharge" for the second plane PLANE2 (i.e., the length of a period between the time t21 and a time t22).

A temperature T1 of the nonvolatile memory device 100 at the time t12 may be higher than a temperature T2 of the nonvolatile memory device 100 at the time t22. Thus, a period P2 of the reference clock signal rCLK during a develop period "SO Develop" for the first plane PLANE1 may be shorter than a period P3 of the reference clock signal rCLK during a develop period "SO Develop" for the second plane PLANE2. Accordingly, the period for which the first bitline shutoff signal BLSHF1 is activated (i.e., the period between the time t11 and a time t14) may be shorter than the period for which the second bitline shutoff signal BLSHF2 is activated (i.e., the period between the time t21 and a time t24).

For example, the period for which the reference clock signal rCLK is switched to the second clock signal CLK_B for the first plane PLANE1, i.e., the period between the time t12 and a time t13, may have the same length as the period for which the reference clock signal rCLK is switched to the second clock signal CLK_B for the second plane PLANE2, i.e., the period between the time t22 and a time t23. In this case, the difference between the length of the period for which the first bitline shutoff signal BLSHF1 (i.e., the period between the time t11 and a time t14) has a first logic level and the length of the period for which the second bitline shut off signal BLSHF2 has the first logic level (i.e., the period between the time t21 and a time t24) may be an integer multiple of the difference between the periods P2 and P3 (where the integer is 1 or greater).

Figure 12:
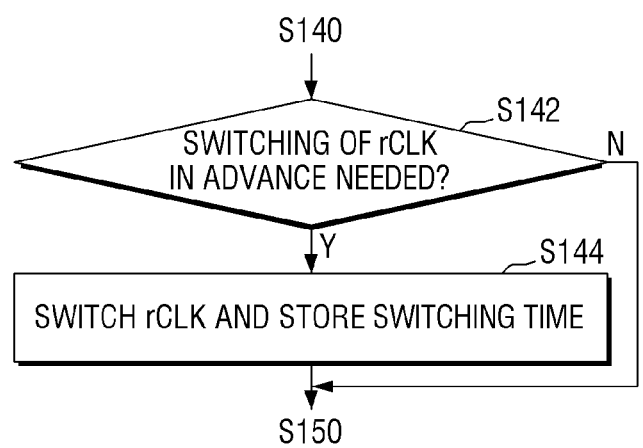
FIG. 12 is a flowchart illustrating the operation of a nonvolatile memory device according to some embodiments of the present disclosure.
Figure 13:
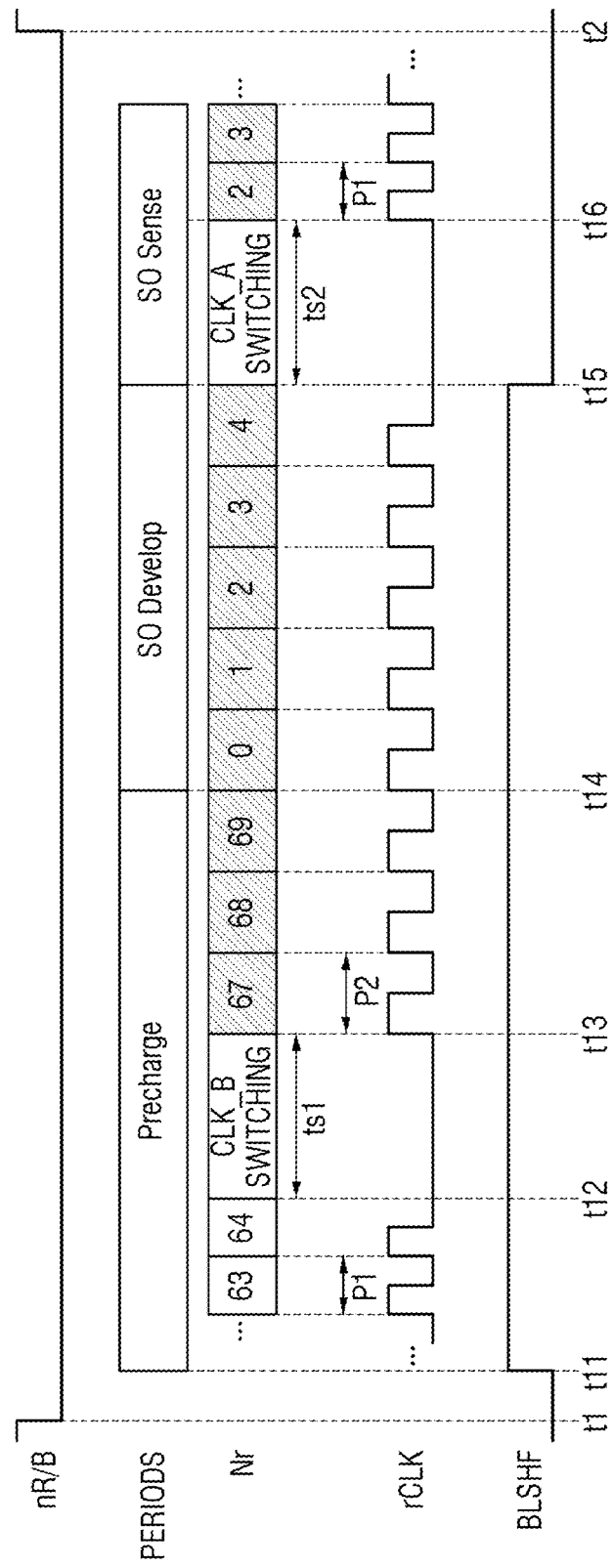
FIG. 13 is a timing diagram illustrating the operation of the nonvolatile memory device of FIG. 12.

FIG. 12 is a flowchart illustrating the operation of a nonvolatile memory device according to some embodiments of the present disclosure. FIG. 13 is a timing diagram illustrating the operation of the nonvolatile memory device of FIG. 12. The embodiment of FIGS. 12 and 13 will hereinafter be described, focusing mainly on the differences with the embodiment of FIGS. 9 and 10.

Referring to FIGS. 5 and 12, the task corresponding to the current period is performed in accordance with the reference clock signal rCLK (S140). Thereafter, each of the schedulers 126_1 through 126_n may determine whether the switching of the reference clock signal rCLK in advance is needed (S142). In a case where the first clock signal CLK_A is currently being output as the reference clock signal rCLK and the subsequent process needs temperature compensation and is more susceptible than the current period to time, each of the schedulers 126_1 through 126_n may determine that the switching of the reference clock signal rCLK in advance is needed. For example, a develop period may be more susceptible to time than a precharge period and a sensing period.

In a case where the switching of the reference clock signal rCLK in advance is not needed (S142), S150 may be performed.

On the contrary, in a case where the switching of the reference clock signal rCLK is needed (S142), each of the schedulers 126_1 through 126_n may switch the reference clock signal rCLK and may store the amount of time that it takes to switch the reference clock signal rCLK, i.e., a switching time is (S144). Each of the schedulers 126_1 through 126_n may switch reference clock signal rCLK by controlling the switching control signals SCNT. Each of the schedulers 126_1 through 126_n may be connected to the second clock generator 122 and output the second clock signal CLK_B as the reference clock signal rCLK in accordance with the switching control signals SCNT. Thereafter, S150 may be performed.

The operation of the nonvolatile memory device of FIG. 12 will hereinafter be described with reference to FIG. 13, taking the first plane PLANE1 as an example. Referring to FIGS. 5 and 13, during a precharge period "Precharge", the nonvolatile memory device 100 may perform a task corresponding to the precharge period "Precharge", using the first clock signal CLK_A as the reference clock signal rCLK.

A subsequent period, i.e., a develop period "SO Develop", is more susceptible to time than the precharge period "Precharge" and needs temperature compensation. Thus, during the precharge period "Precharge", the first clock switching controller 123_1, which corresponds to the first plane PLANE1, may switch the reference clock signal rCLK to the second clock signal CLK_B in advance before the beginning of the develop period "SO Develop". The second clock generator 122 may determine a period P2 of the second clock signal CLK_B based on the temperature measured at a time t12. The lower the temperature measured at, for example, the time t12, for period P2 of the second clock signal CLK_B, the shorter the period P2 of the second clock signal CLK_B.

The reference clock signal rCLK may have a uniform logic level during a period between the time t12 and a time t13 when the reference clock signal rCLK is being switched. At the time t13, the clock switching controller 123 may output a perfect second clock signal CLK_B without any glitch or short pulse as the reference clock signal rCLK. From the time t13 on, the nonvolatile memory device 100 may perform the task corresponding to the precharge period "Precharge", using the second clock signal CLK_B as the reference clock signal rCLK.

At the end of the precharge period "Precharge", i.e., at a time t14, the counting signal Nr may be smaller than a predetermined value of 69 due to the switching time ts1. Thus, the first scheduler 126_1, which corresponds to the first plane PLANE1, may correct the counting signal Nr with the predetermined value of 69. As a result, the precharge period "Precharge" may be able to end at the time t14. The length of the precharge period "Precharge" (i.e., the length of the period between the time t12 and the time t14) may be the period P1 of the first clock signal CLK_A multiplied by the predetermined value of 69.

During the develop period "SO Develop", the nonvolatile memory device 100 may perform a task corresponding to the develop period "SO Develop", using the second clock signal CLK_B as the reference clock signal rCLK. As no switching time has occurred during the develop period "SO Develop", the end point of the develop period "SO Develop" does not need to be corrected at the end of the develop period "SO Develop", i.e., at a time t15. That is, the counting signal Nr may be identical to a predetermined value of 4. Thus, the develop period "SO Develop" may be able to end at the time t15.

As a subsequent period, i.e., a sensing period "SO Sense", does not need temperature compensation and the second clock signal CLK_B is currently being used as the reference clock signal rCLK, the switching of the reference clock signal rCLK is needed at the beginning of the sensing period "SO Sense", i.e., at the time t15. Thus, the first clock switching controller 123_1 may switch the reference clock signal rCLK to the first clock signal CLK_A at the beginning of the sensing period "SO Sense", i.e., at the time t15. The reference clock signal rCLK may have a uniform logic level during a period between the time t15 and a time t16 when the reference clock signal rCLK is being switched. From the time t16 on, the nonvolatile memory device 100 may perform a task corresponding to the sensing period "SO Sense", using the first clock signal CLK_A as the reference clock signal rCLK.

At the end of the sensing period "SO Sense", the counting signal Nr may be smaller than a predetermined value due to a switching time ts2. Thus, the first scheduler 126_1 may correct the end point of the sensing period "SO Sense" by correcting the counting signal Nr with the predetermined value.

The embodiment of FIGS. 12 and 13 has been described so far, taking one plane, i.e., the first plane PLANE1, as an example, but the nonvolatile memory device 100 may operate in the same manner as described above with reference to FIGS. 12 and 13 for the rest of the first through sixteenth planes PLANE1 through PLANE16.

Figure 14:
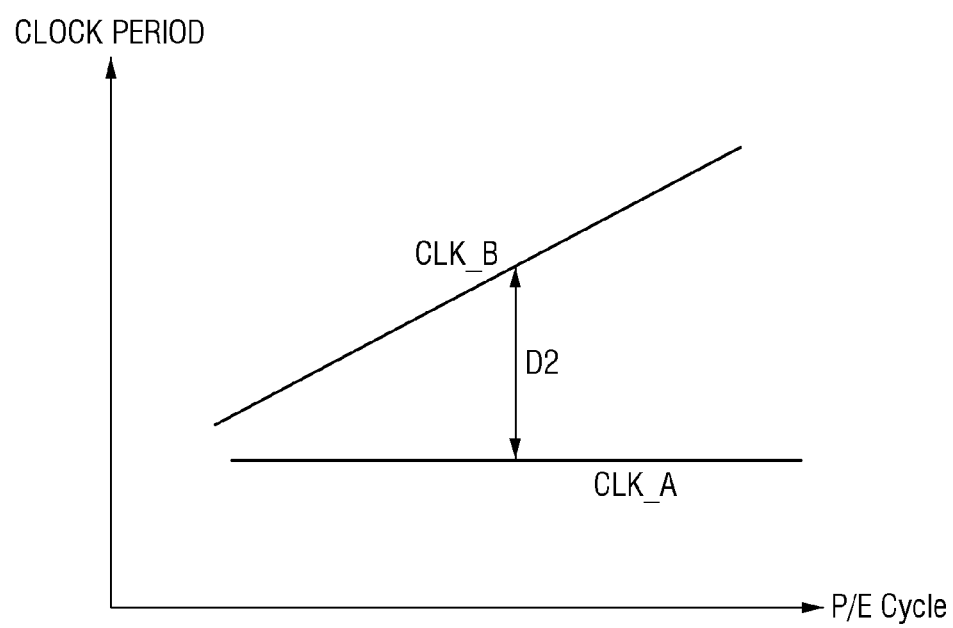
FIG. 14 is a graph for explaining the first and second clock generators of FIG. 5.

FIG. 14 is a graph for explaining the first and second clock generators of FIG. 5.

Referring to FIG. 5, the first clock generator 121 may generate the first clock signal CLK_A, which has a fixed first period. The second clock generator 122 may generate the second clock signal CLK_B, which has a second period that varies depending on the temperature and the program/erase (P/E) cycle of the nonvolatile memory device 100, as illustrated in FIGS. 6 and 14. The second clock generator 122 may generate the second clock signal CLK_B in consideration of the temperature and the P/E cycle of the nonvolatile memory device 100.

Referring to FIG. 14, the first clock signal CLK_A may have a uniform period regardless of the P/E cycle of the nonvolatile memory device 100. The longer the P/E cycle of the nonvolatile memory device 100 is, the more the memory cells of the nonvolatile memory device 100 deteriorate. Thus, a longer develop period is needed. Accordingly, the second clock signal CLK_B may have a longer period for a longer P/E cycle. As the P/E cycle of the nonvolatile memory device 100 increases, a difference D2 between the period of the first clock signal CLK_A and the period of the second clock signal CLK_B may increase.

Figure 15:
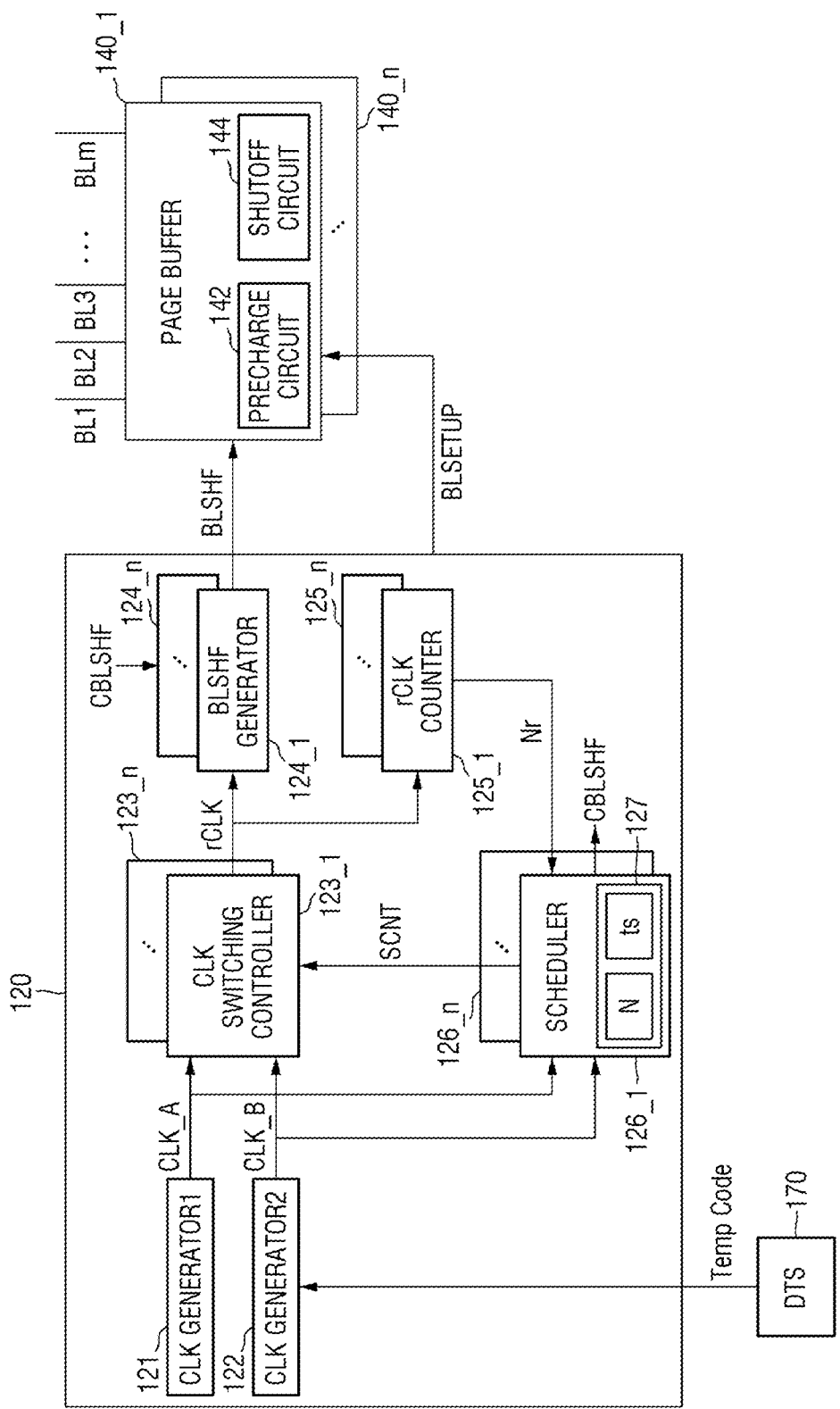
FIG. 15 is a block diagram of a nonvolatile memory device according to some embodiments of the present disclosure.

FIG. 15 is a block diagram of a nonvolatile memory device according to some embodiments of the present disclosure. FIG. 15 is a block diagram illustrating how the control logic 120 and the page buffer unit 140 of FIG. 2 are connected. For convenience, the embodiment of FIG. 15 will hereinafter be described, focusing mainly on the differences with the embodiment of FIG. 5.

Referring to FIG. 15, the nonvolatile memory device may further include a digital temperature sensor (DTS) 170. The DTS 170 may measure the temperature of the nonvolatile memory device in real time. The DTS 170 may output temperature code "Temp Code" based on the result of the measurement. A second clock generator 122 may generate a second clock signal CLK_B having a second period based on the temperature code "Temp Code".

Figure 16:
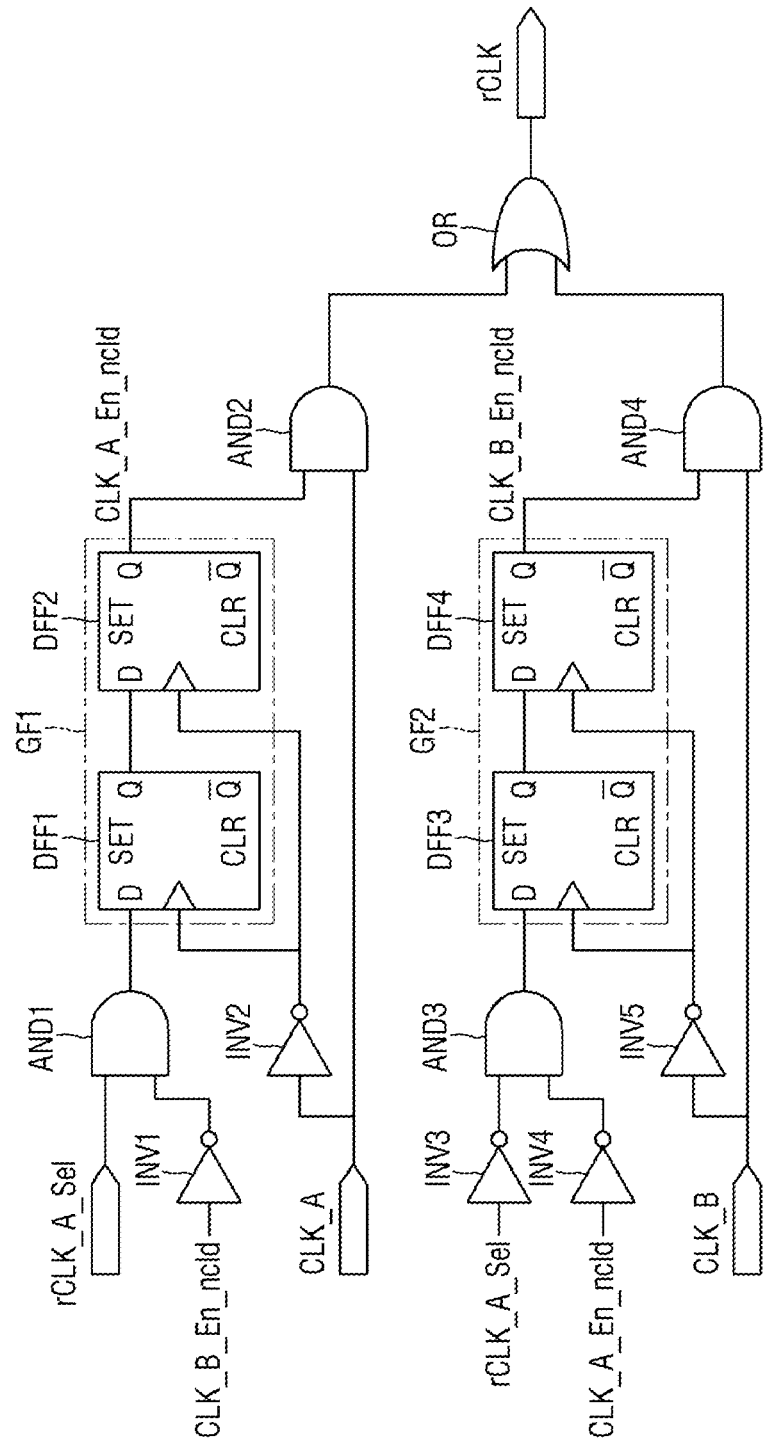
FIG. 16 is a circuit diagram of a clock switching controller of FIG. 5.

FIG. 16 is a circuit diagram of the clock switching controller of FIG. 5.

Referring to FIGS. 5 and 16, a clock switching controller 123 may receive switching control signals SCNT from a scheduler 126. The switching control signals SCNT may include a first clock selection signal rCLK_A_Sel, a first clock enable signal CLK_A_En_ncld, and a second clock enable signal CLK_B_En_ncld.

A first AND gate AND1 may perform an AND operation on a first clock selection signal rCLK_A_Sel and an inverted second clock enable signal provided a first inverter INV1, and may provide the result of the AND operation to a first synchronizer GF1. The first synchronizer GF1 may include first and second flipflops DFF1 and DFF2, which are connected in series. The first synchronizer GF1 may synchronize the output signal of the first AND gate AND1 with an inverted first clock signal provided by a second inverter INV2. As a result, the first synchronizer GF1 may output a perfect first clock enable signal CLK_A_En_ncld without any glitch. A second AND gate AND2 may control the transmission of a first clock signal CLK_A in accordance with the first clock enable signal CLK_A_En_ncld.

A third AND gate AND3 may perform an AND operation on an inverted first clock selection signal provided by a third inverter INV3 and an inverted first clock enable signal provided by a fourth inverter INV4 and may provide the result of the AND operation to a second synchronizer GF2. The second synchronizer GF2 may include third and fourth flipflops DFF3 and DFF4, which are connected in series. The second synchronizer GF2 may synchronize the output signal of the third AND gate AND3 with an inverted second clock signal provided by a fifth inverter INV5. As a result, the second synchronizer GF2 may output a perfect second clock enable signal CLK_B_En_ncld without any glitch. A fourth AND gate AND4 may control the transmission of the second clock signal CLK_B in accordance with the second clock enable signal CLK_B_En_ncld.

An OR gate OR may output a reference clock signal rCLK by performing an OR operation on the output signal of the second AND gate AND2 and the output signal of the fourth AND gate AND4. The OR gate OR may output one of the first and second clock signals CLK_A and CLK_B as the reference clock signal rCLK in accordance with the first and second clock enable signals CLK_A_En_ncld and CLK_B_En_ncld.

Figure 17:
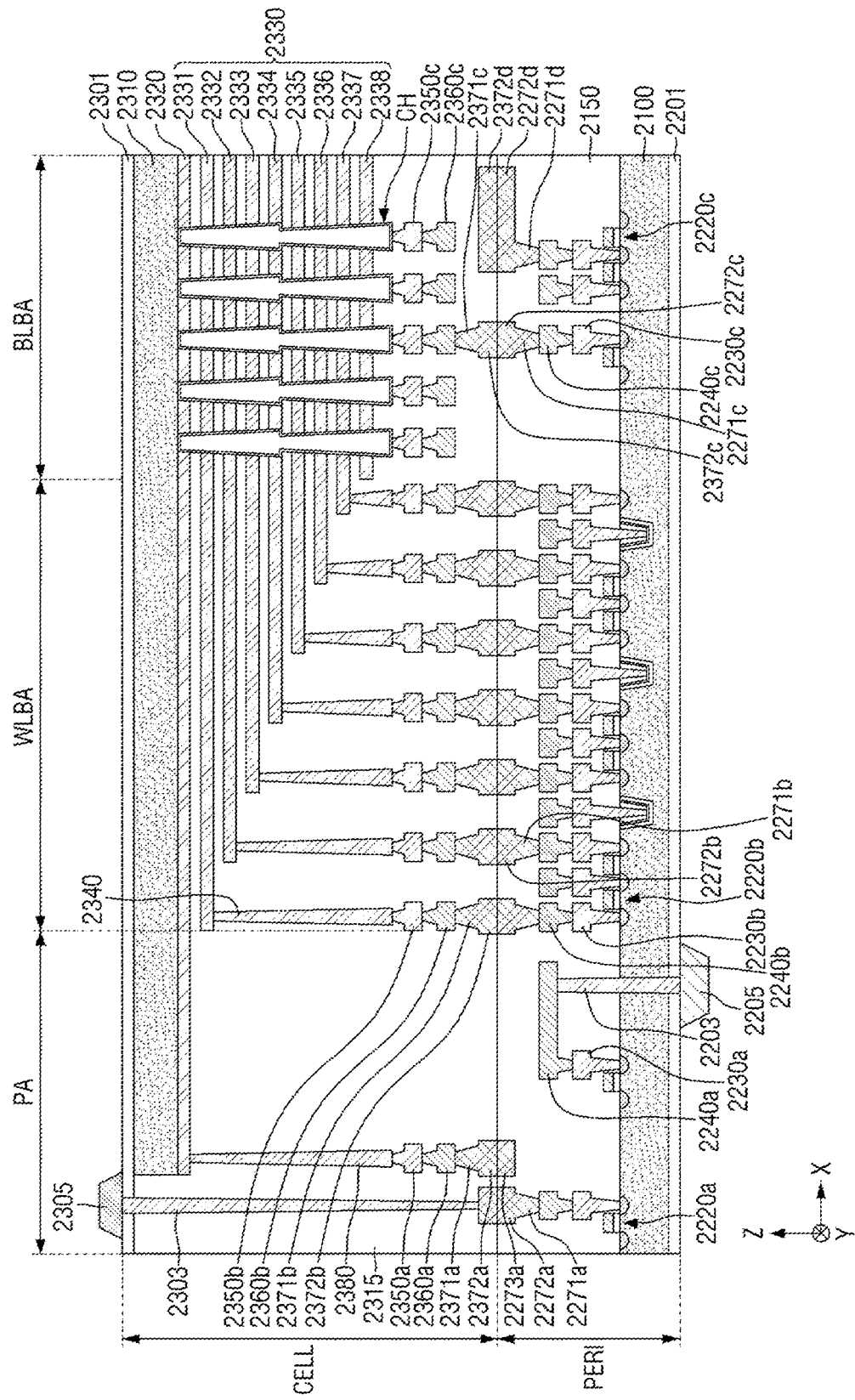
FIG. 17 is a cross-sectional view of a nonvolatile memory device according to some embodiments of the present disclosure.

FIG. 17 is a cross-sectional view of a nonvolatile memory device according to some embodiments of the present disclosure.

Referring to FIG. 17, the nonvolatile memory device may have a chip-to-chip (C2C) structure. The C2C structure may refer to a structure obtained by fabricating a first chip, including a cell region CELL, on a first wafer, fabricating a second chip, including a peripheral circuit region PERI, on a second wafer, which is different from the first wafer, and connecting the first and second chips via a bonding method.

The bonding method may refer to a method that electrically connects a bonding metal formed in an uppermost metal layer of an upper chip and a bonding metal formed in an uppermost metal layer of a lower chip. For example, in a case where the bonding metals are formed of copper (Cu), the bonding method may be a Cu—Cu bonding method. The bonding metals may also be formed of aluminum (Al) or tungsten (W).

Each of the peripheral circuit region PERI and the cell region CELL may include an external pad bonding area PA, a wordline bonding area WLBA, and a bitline bonding area BLBA.

The peripheral circuit region PERI may include a first substrate 2100, an interlayer insulating layer 2150, a plurality of circuit elements (2220a, 2220b, and 2220c), which are formed on the first substrate 2100, first metal layers (2230a, 2230b, and 2230c), which are connected to their respective circuit elements (2220a, 2220b, and 2220c), and second metal layers (2240a, 2240b, and 2240c), which are formed on their respective first metal layers (2230a, 2230b, and 2230c). The first metal layers (2230a, 2230b, and 2230c) may be formed of a metal with a relatively high resistance such as W, and the second metal layers (2240a, 2240b, and 2240c) may be formed of a metal with a relatively low resistance such as Cu.

Only the first metal layers (2230a, 2230b, and 2230c) and the second metal layers (2240a, 2240b, and 2240c) are illustrated in FIG. 17, but the present disclosure is not limited thereto. Alternatively, one or more metal layers may be further formed on each of the second metal layers (2240a, 2240b, and 2240c). At least some of the metal layers formed on each of the second metal layers (2240a, 2240b, and 2240c) may be formed of Al having a lower resistance than the material of the second metal layers (2240a, 2240b, and 2240c), i.e., Cu.

The interlayer insulating layer 2150 may be disposed on the first substrate 2100 to cover the circuit elements (2220a, 2220b, and 2220c), the first metal layers (2230a, 2230b, and 2230c), and the second metal layers (2240a, 2240b, and 2240c) and may include an insulating material such as silicon oxide or silicon nitride.

Lower bonding metals 2271b and 2272b may be formed on second metal layers 2240b in the wordline bonding area WLBA. The lower bonding metals 2271b and 2272b of the peripheral circuit region PERI may be electrically connected to upper bonding metals 2371b and 2372b of the cell region via bonding, and the lower bonding metals 2271b and 2272b and the upper bonding metals 2371b and 2372b may be formed of Al, Cu, or W.

The cell region CELL may provide one or more memory blocks. The cell region CELL may include a second substrate 2310 and a common source line 2320. A plurality of wordlines 2331 to 2338 (i.e., 2330) may be stacked on the second substrate 2310 in a direction perpendicular to the top surface of the second substrate 2310, i.e., in a Z-axis direction. String selection lines and a ground selection line may be disposed above and below the wordlines 2330, and the wordlines 2330 may be disposed between the string selection lines and the ground selection line.

In the bitline bonding area BLBA, channel structures CH may extend in the direction perpendicular to the top surface of the second substrate 2310 to penetrate the wordlines 2330, the string selection lines, and the ground selection line. Each of the channel structures CH may include a data storage layer, a channel layer, and a buried insulating layer, and the channel layers of the channel structures CH may be electrically connected to first metal layers 2350c and second metal layers 2360c. For example, the first metal layers 2350c may be bitline contacts, and the second metal layers 2360c may be bitlines. The bitlines 2360c may extend in a first direction (or a Y-axis direction) parallel to the top surface of the second substrate 2310.

In the embodiment of FIG. 17, an area where the channel structures CH and the bitlines 2360c are disposed may be defined as the bitline bonding area BLBA. The bitlines 2360c may be electrically connected to circuit elements 2220c providing page buffer circuits in the bitline bonding area BLBA of the peripheral circuit region PERI. For example, the bitlines 2360c may be connected to the upper bonding metals 2371c and 2372c in the peripheral circuit region PERI, and the upper bonding metals 2371c and 2372c may be connected to the lower bonding metals 2271c and 2272c, which are connected to the circuit elements 2220c of the page buffer circuits.

In the wordline bonding area WLBA, the wordlines 2330 may extend in a second direction (or an X-axis direction), which is parallel to the top surface or the bottom surface of the second substrate 2310 and may be connected to a plurality of cell contact plugs 2340. The wordlines 2330 and the cell contact plugs 2340 may extend in different lengths and may be connected to one another at pads that are provided. First metal layers 2350b and second metal layers 2360b may be sequentially connected above or below the cell contact plugs 2340, which are connected to the wordlines 2330. The cell contact plugs 2340 may be connected to the peripheral circuit region PERI through the upper bonding metals 2371b and 2372b of the cell region CELL and the lower bonding metals 2271b and 2272b of the peripheral circuit region PERI, in the wordline bonding area WLBA.

The cell contact plugs 2340 may be electrically connected to circuit elements 2220b providing row decoders in the peripheral circuit region PERI. The operating voltage of circuit elements 2220b providing row address decoders may differ from the operating voltage of circuit elements 2220c providing page buffer circuits. For example, the operating voltage of the circuit elements 2220c providing page buffer circuits may be higher than the operating voltage of the circuit elements 2220b providing row address decoders.

A common source line contact plug 2380 may be disposed in the external pad bonding area PA. The common source line contact plug 2380 may be formed of a conductive material such as a metal, a metal compound, or a conductive material such as polysilicon and may be electrically connected to the common source line 2320. A first metal layer 2350a and a second metal layer 2360a may be sequentially stacked on the common source line contact plug 2380. For example, an area where the common source line contact plug 2380, the first metal layer 2350a, and the second metal layer 2360a are disposed may be defined as the external pad bonding area PA. The second metal layer 2360a may be electrically connected to an upper metal via 2371a. The upper metal via 2371a may be electrically connected to an upper metal pattern 2372a.

Input/output pads 2205 and 2305 may be disposed in the external pad bonding area PA. A lower insulating film 2201 may be formed below the first substrate 2100 to cover the bottom surface of the first substrate 2100, and the first input/output pad 2205 may be formed on the lower insulating film 2201. The first input/output pad 2205 may be connected to at least one of the circuit elements (2220a, 2220b, and 2220c) in the peripheral circuit region PERI and may be separated from the first substrate 2100 by the lower insulating film 2201. A side insulating layer may be disposed between the first input/output contact plug 2203 and the first substrate 2100 to electrically isolate the first input/output contact plug 2203 from the first substrate 2100.

An upper insulating film 2301 may be formed above the second substrate 2310 to cover the top surface of the second substrate 2310, and the second input/output pad 2305 may be disposed on the upper insulating film 2301. The second input/output pad 2305 may be connected to at least one of the circuit elements (2220a, 2220b, and 2220c) in the peripheral circuit region PERI through a second input/output contact plug 2303, a lower metal pattern 2272a and a lower metal via 2271a.

The circuit elements (2220a, 2220b, and 2220c) may include peripheral circuits described above with reference to FIGS. 1 and 2. For example, although not specifically illustrated, the memory interface circuit 110, the control logic 120, the memory cell array 130, and the page buffer unit 140 of FIG. 2 may be disposed above the second substrate 2310.

In the region where the second input/output contact plug 2303 is disposed, the second substrate 2310 and the common source line 2320 may not be disposed. Also, the second input/output pad 2305 may not overlap with the wordlines 2330 in a third direction (or a Z-axis direction). The second input/out contact plug 2305 may be separated from the second substate 2310 in the direction parallel to the top surface of the second substrate 2201 and may be connected to the second input/output pad 2305 through an interlayer insulating layer 2315 in the cell region CELL.

The first and second input/output pads 2205 and 2305 may be optional. The nonvolatile memory device may include only the first input/output pad 2205 below the first substrate 2100 or only the second input/output pad 2305 above the second substrate 2310. Alternatively, the nonvolatile memory device may include both the first and second input/output pads 2205 and 2305.

In the external pad bonding area PA and the bitline bonding area BLBA, which are included in each of the cell region CELL and the peripheral circuit region PERI, metal patterns from an uppermost metal layer may exist as dummy patterns, or the uppermost metal layer may be empty.

In the external pad bonding area PA, a lower metal pattern 2273a may be formed in the uppermost metal layer of the peripheral cell region PERI in the same shape as an upper metal pattern 2372a, which is formed in the uppermost metal layer of the cell region CELL, to correspond to the upper metal pattern 2372a. The lower metal pattern 2273a may not be connected to any particular contact in the peripheral circuit region PERI. Similarly, an upper metal pattern may be formed in the uppermost metal layer of the cell region in the same shape as the lower metal pattern 2273a, which is formed in the uppermost metal layer of the peripheral circuit region PERI, to correspond to the lower metal pattern 2273a.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL via bonding.

Also, in the bitline bonding area BLBA, an upper metal pattern 2372d may be formed in the uppermost metal layer of the cell region CELL in the same shape as a lower metal pattern 2272d, which is formed in the uppermost metal layer of the peripheral circuit region PERI, to correspond to the lower metal pattern 2272d. The lower metal pattern 2272d may be electrically connected to a lower metal via 2271d. No contact may be formed on the upper metal pattern 2372d.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A nonvolatile memory device comprising:
a memory cell array including three or more planes;
a first clock generator configured to generate a first clock signal having a first period that is fixed regardless of temperature;
a second clock generator configured to generate a second clock signal having a second period that varies with temperature;
a plurality of clock switching controllers configured to selectively output one of the first clock signal or the second clock signal as a reference clock signal;
a control logic including a plurality of bitline shutoff generators configured to output a plurality of bitline shutoff signals based on the reference clock signal; and
a plurality of page buffers configured to connect bitlines of the planes and data latch nodes in accordance with the bitline shutoff signals.

2. The nonvolatile memory device of claim 1, wherein the second clock generator is configured to generate the a second clock signal having a shorter second period for a higher temperature.

3. The nonvolatile memory device of claim 1, wherein the second clock generator is configured to generate the second clock signal having the second period that varies with a program/erase cycle of the nonvolatile memory device.

4. The nonvolatile memory device of claim 3, wherein the second clock generator is configured to generate the second clock signal having a longer second period for a longer program/erase cycle of the nonvolatile memory device.

5. The nonvolatile memory device of claim 1, wherein:
the control logic is configured to generate a plurality of bitline setup signals,
the page buffers are configured to supply precharge voltages to bitlines of their respective planes in accordance with their respective bitline setup signals,
one of the plurality of clock switching controllers is configured to output the first clock signal as the reference clock signal before a first switching time and to output the second clock signal as the reference clock signal after the first switching time, and
the first switching time is included in a time period for which the bitline setup signals are activated.

6. The nonvolatile memory device of claim 5, wherein:
the one of the plurality of clock switching controllers is configured to output the first clock signal as the reference clock signal after a second switching time, which comes after the first switching time, and
the second switching time is included in a period for which the bitline setup signals are inactivated.

7. The nonvolatile memory device of claim 1, wherein:
the control logic is configured to generate a plurality of bitline setup signals,
the page buffers are configured to supply precharge voltages to bitlines of their respective planes in accordance with their respective bitline setup signals,
one of the plurality of clock switching controllers is configured to output the first clock signal as the reference clock signal before a first switching time and to output the second clock signal as the reference clock signal after the first switching time, and
the first switching time is when the bitline setup signals are inactivated.

8. A nonvolatile memory device comprising:
a memory cell array including first and second planes;
a first clock generator configured to generate a first clock signal having a first period that is fixed regardless of temperature;
a second clock generator configured to generate a second clock signal having a second period that varies with temperature;
a first bitline shutoff signal generator configured to output a first bitline shutoff signal based on the first clock signal or the second clock signal;
a second bitline shutoff signal generator configured to output a second bitline shutoff signal based on the first clock signal or the second clock signal;
a first page buffer configured to connect a first bitline of the first plane and a first data latch node in accordance with the first bitline shutoff signal; and
a second page buffer configured to connect a second bitline of the second plane and a second data latch node in accordance with the second bitline shutoff signal, wherein
as the temperature increases, a difference between the first and second periods decreases.

9. The nonvolatile memory device of claim 8, wherein:
the first bitline shutoff signal generator is configured to output the first bitline shutoff signal based on the first clock signal during (1-1)-th and (1-2)-th time periods,
the second bitline shutoff signal generator is configured to output the second bitline shutoff signal based on the first clock signal during a (2-1)-th time period and to output the second bitline shutoff signal based on the second clock signal during a (2-2)-th time period,
the first page buffer is configured to supply a first precharge voltage to the first bitline during the (1-1)-th time period and to cut off the supply of the first precharge voltage to the first bitline during (1-2)-th time period,
the second page buffer is configured to supply a second precharge voltage to the second bitline during the (2-1)-th time period and to cut off the supply of the second precharge voltage to the second bitline during the (2-2)-th time period,
the (1-1)-th and (1-2)-th time periods are sequentially consecutive, and
the (2-1)-th and (2-2)-th time periods are sequentially consecutive.

10. The nonvolatile memory device of claim 9, further comprising:
a first memory configured to store a first counting value determined in advance;
a first reference counter configured to output a first counting signal by counting the first clock signal during the (1-2)-th time period; and
a first corrector configured to correct the first counting signal with the first counting value at an end of the (1-2)-th time period.

11. The nonvolatile memory device of claim 9, wherein the (1-1)-th and (2-1)-th time periods have the same length.

12. The nonvolatile memory device of claim 9, wherein:
the first bitline shutoff signal generator is configured to output the first bitline shutoff signal based on the first clock signal during a (1-3)-th time period,
the second bitline shutoff signal generator is configured to output the second bitline shutoff signal based on the first clock signal during a (2-3)-th time period, the first page buffer is configured to disconnect the first bitline and the first data latch node during (1-3)-th time period, the second page buffer is configured to disconnect the second bitline and the second data latch node during the (2-3)-th time period, the (1-2)-th and (1-3)-th time periods are sequentially consecutive, and the (2-2)-th and (2-3)-th time periods are sequentially consecutive.

13. The nonvolatile memory device of claim 9, wherein:

the first bitline shutoff signal generator is configured to output the first bitline shutoff signal based on the first clock signal during the (1-1)-th and (1-2)-th time periods, the second bitline shutoff signal generator is configured to output the second bitline shutoff signal based on the first clock signal during a first subperiod of the (2-1)-th time period and to output the second bitline shutoff signal based on the second clock signal during a second subperiod of the (2-1)-th time period and during the (2-2)-th time period, the first page buffer is configured to supply the first precharge voltage to the first bitline during the (1-1)-th time period and to cut off the supply of the first precharge voltage to the first bitline during the (1-2)-th time period, the second page buffer is configured to supply the second precharge voltage to the second bitline during the (2-1)-th time period and to cut off the supply of the second precharge voltage to the second bitline during the (2-2)-th time period, the (1-1)-th and (1-2)-th time periods are sequentially consecutive, the (2-1)-th and (2-2)-th time periods are sequentially consecutive, and the first and second subperiods are sequentially consecutive.

14. The nonvolatile memory device of claim 13, further comprising:

a first memory configured to store a first counting value determined in advance;

a first reference counter configured to output a first counting signal by counting the first clock signal during the (1-1)-th time period; and a first corrector configured to correct the first counting signal with the first counting value at an end of the (1-1)-th time period.

15. The nonvolatile memory device of claim 8, further comprising:

a temperature sensor configured to sense the temperature of the nonvolatile memory device and to output a temperature code corresponding to the sensed temperature of the nonvolatile memory device, wherein the second clock generator is configured to generate the second clock signal based on the temperature code.

16. The nonvolatile memory device of claim 8, wherein the second clock generator is configured to generate the second clock signal based further on a program/erase cycle of the nonvolatile memory device.

17. A nonvolatile memory device comprising:

a memory cell array including three or more planes;

a first clock generator configured to generate a first clock signal having a first period;

a second clock generator configured to generate a second clock signal having a second period that varies;

a plurality of clock switching controllers configured to output the first clock signal as a reference clock signal during first and third time periods, to output the second clock signal as the reference clock signal during a second time period, and to output a signal having a first logic level as the reference clock signal during first and second switching periods;

a control logic configured to output a plurality of page buffer control signals based on the reference clock signal output by the plurality of clock switching controllers; and a plurality of page buffers operating in accordance with the plurality of page buffer control signals, wherein the first time period, the first switching period, the second time period, the second switching period, and the third time period are sequentially consecutive.

18. The nonvolatile memory device of claim 17, wherein:

the second time period includes (2-1)-th and (2-2)-th time periods that are sequentially consecutive, and the plurality of page buffers are configured to connect bitlines of the planes and data latch nodes during the first time period, the first switching period and the (2-1)-th time period, to supply precharge voltages to the data latch nodes and cut off the supply of the precharge voltages to the data latch nodes during the (2-2)-th time period, and to disconnect the bitlines and the data latch nodes during the second switching period and the third time period.

19. The nonvolatile memory device of claim 17, wherein the plurality of page buffers are configured to connect bitlines of the planes and data latch nodes and supply precharge voltages to the data latch nodes during the first time period, to cut off the supply of the precharge voltages to the data latch nodes during the first switching period and the second time period, and to disconnect the bitlines and the data latch nodes during the second switching period and the third time period.

20. The nonvolatile memory device of claim 17, wherein the second clock generator is configured to generate the second clock signal based on at least one of temperature or a program/erase cycle of the nonvolatile memory device.

* * * * *